US005512411A

United States Patent [19]

Lynch et al.

[11] Patent Number: 5,512,411

[45] Date of Patent: Apr. 30, 1996

[54] SULFONYL HYDRAZIDE DEVELOPERS FOR PHOTOTHERMOGRAPHIC AND THERMOGRAPHIC

[75] Inventors: Doreen C. Lynch, Afton; Sharon M. Simpson, Lake Elmo; Paul G. Skoug, Stillwater, all of Minn.

[73] Assignee: Minnesota Mining & Manufacturing Company, Saint Paul, Minn.

[21] Appl. No.: 517,380

[22] Filed: Aug. 21, 1995

Related U.S. Application Data

[62] Division of Ser. No. 369,738, Jan. 4, 1995, Pat. No. 5,464,738.

[51] Int. Cl.[6] .............................. G03C 1/498; G03F 1/00

[52] U.S. Cl. .......................... 430/203; 430/300; 430/348; 430/350; 430/617; 430/264; 430/619

[58] Field of Search .................................... 430/300, 350, 430/348, 617, 619, 264, 203

[56] References Cited

U.S. PATENT DOCUMENTS

| | | | |
|---|---|---|---|
| 4,395,484 | 7/1983 | McCarney | 430/620 |
| 5,384,238 | 1/1995 | Ellis et al. | 430/617 |

*Primary Examiner*—Thorl Chea

*Attorney, Agent, or Firm*—Gary L. Griswold; Walter N. Kirn; Gregory A. Evearitt

[57] ABSTRACT

Sulfonyl hydrazides are used as developers in photothermographic and thermographic elements. The sulfonyl hydrazides have the formula:

$$R^1—CO—NHNH—SO_2—R^2$$

wherein $R^1$ and $R^2$ may be each independently selected from the group consisting of alkyl and alkenyl groups of up to 20 carbon atoms, preferably alkyl and alkenyl of up to 10 carbon atoms, more preferably alkyl and alkenyl groups of up to 5 carbon atoms; alkoxy groups of up to 20 carbon atoms, preferably of up to 10 carbon atoms, and more preferably of up to 5 carbon atoms; aryl, alkaryl, and aralkyl groups of up to 20 carbon atoms, preferably of up to 10 carbon atoms, and more preferably up to 6 carbon atoms; aryloxy groups of up to 20 carbon atoms, preferably of up to 10 carbon atoms, and more preferably of up to 6 carbon atoms; non-aromatic and aromatic heterocyclic ring groups containing up to 6 ring atoms; alicyclic ring groups containing up to 6 ring carbon atoms; and fused ring and bridging groups comprising up to 14 ring atoms.

The photothermographic and thermographic elements the present invention may be used as a photomaks in a process where there is a subsequent exposure of an ultraviolet radiation sensitive imageable medium.

8 Claims, No Drawings

SULFONYL HYDRAZIDE DEVELOPERS FOR PHOTOTHERMOGRAPHIC AND THERMOGRAPHIC

This is a division of application Ser. No. 08/369,738 filed Jan. 6, 1995, now U.S. Pat. No. 5,464,738.

BACKGROUND OF THE INVENTION

1. Field of Invention

This invention relates to novel, heat-developable photothermographic and thermographic elements and in particular, it relates to novel sulfonyl hydrazide developers exhibiting improved photothermographic properties, such as high contrast, when used in photothermographic and thermographic elements.

2. Background to the Art

Silver halide-containing, photothermographic imaging materials (i.e., heat-developable photographic elements) processed with heat, and without liquid development, have been known in the art for many years. These materials, also known as "dry silver" compositions or emulsions, generally comprise a support having coated thereon: (a) a photosensitive material that generates silver atoms when irradiated; (b) a non-photosensitive, reducible silver source; (c) a reducing agent (i.e., a developer) for silver ion, for example the silver ion in the non-photosensitive, reducible silver source; and (d) a binder.

The photosensitive material is generally photographic silver halide which must be in catalytic proximity to the non-photosensitive, reducible silver source. Catalytic proximity requires an intimate physical association of these two materials so that when silver atoms (also known as silver specks, clusters, or nuclei) are generated by irradiation or light exposure of the photographic silver halide, those nuclei are able to catalyze the reduction of the reducible silver source. It has long been understood that silver atoms (Ag°) are a catalyst for the reduction of silver ions, and that the photosensitive silver halide can be placed into catalytic proximity with the non-photosensitive, reducible silver source in a number of different fashions. For example, catalytic proximity can be accomplished by partial metathesis of the reducible silver source with a halogen-containing source (see, for example, U.S. Pat. No. 3,457,075); by coprecipitation of silver halide and the reducible silver source material (see, for example, U.S. Pat. No. 3,839,049); and other methods that intimately associate the photosensitive, photographic silver halide and the non-photosensitive, reducible silver source.

The non-photosensitive, reducible silver source is a material that contains silver ions. Typically, the preferred non-photosensitive reducible silver source is a silver salt of a long chain aliphatic carboxylic acid having from 10 to 30 carbon atoms. The silver salt of behenic acid or mixtures of acids of similar molecular weight are generally used. Salts of other organic acids or other organic materials, such as silver imidazolates, have been proposed. U.S. Pat. No. 4,260,677 discloses the use of complexes of inorganic or organic silver salts as non-photosensitive, reducible silver sources.

In both photographic and photothermographic emulsions, exposure of the photographic silver halide to light produces small clusters of silver atoms (Ag°). The imagewise distribution of these clusters is known in the art as a latent image. This latent image is generally not visible by ordinary means. Thus, the photosensitive emulsion must be further processed to produce a visible image. This is accomplished by the reduction of silver ions which are in catalytic proximity to silver halide grains bearing the clusters of silver atoms, i.e., the latent image.

The reducing agent for the organic silver salt, often referred to as a "developer," may be any material, preferably any organic material, that can reduce silver ion to metallic silver. At elevated temperatures, in the presence of the latent image, the non-photosensitive reducible silver source (e.g., silver behenate) is reduced by the reducing agent for silver ion. This produces a negative black-and-white image of elemental silver.

While conventional photographic developers such as methyl gallate, hydroquinone, substituted-hydroquinones, hindered phenols, catechol, pyrogallol, ascorbic acid, and ascorbic acid derivatives are useful, they tend to result in very reactive photothermographic formulations and fog during preparation and coating of the photothermographic element. As a result, hindered bisphenol reducing agents have traditionally been preferred.

A wide range of reducing agents have been disclosed in dry silver systems including amidoximes, such as phenylamidoxime, 2-thienylamidoxime and p-phenoxy-phenylamidoxime; hydrazines, such as 4-hydroxy-3,5-dimethoxybenzaldehydrazine; a combination of aliphatic carboxylic acid aryl hydrazides and ascorbic acid, such as 2,2'-bis(hydroxymethyl)propionylbetaphenyl hydrazide in combination with ascorbic acid; a combination of polyhydroxybenzene and hydroxylamine; a reductone and/or a hydrazine, such as a combination of hydroquinone and bis(ethoxyethyl)hydroxylamine, piperidinohexose reductone, or formyl-4-methylphenylhydrazine; hydroxamic acids, such as phenylhydroxamic acid, p-hydroxyphenylhydroxamic acid, and o-alaninehydroxamic acid; a combination of azines and sulfonamidophenols, such as phenothiazine and p-benzenesulfonamidophenol, and 2,6-dichloro-4-benzenesulfonamidophenol; α-cyanophenylacetic acid derivatives, such as ethyl α-cyano-2-methylphenylacetate, ethyl α-cyano-phenylacetate; bis-o-naphthols, such as 2,2'-dihydroxyl-1-binaphthyl, 6,6'-dibromo-2,2'-dihydroxy-1,1'-binaphthyl, and bis(2-hydroxy-1-naphthyl)methane; a combination of bis-o-naphthol and a 1,3-dihydroxybenzene derivative, such as 2,4-dihydroxybenzophenone or 2,4-dihydroxyacetophenone; 5-pyrazolones such as 3-methyl-1-phenyl-2-pyrazolin-5-one; reductones, such as dimethylaminohexose reductone, anhydrodihydroaminohexose reductone, and anhydrodihydro-piperidone-hexose reductone; sulfonamidophemol reducing agents, such as 2,6-dichloro-4-benzenesulfonamidophenol and p-benzenesulfonamidophenol; indane-1,3-diones, such as 2-phenylindane-1,3-dione; chromans, such as 2,2-dimethyl-7-t-butyl-6-hydroxychroman; 1,4-dihydropyridines, such as 2,6-dimethoxy-3,5-dicarbethoxy-1,4dihydropyridine; bisphenols, such as bis(2-hydroxy-3-t-butyl-5-methylphenyl)methane, 1,1-bis(2-hydroxy-3,5-dimethylphenyl)-3,5,5-trimethylhexane, 2,2-bis(4-hydroxy-3-methylphenyl)propane, 4,4-ethylidene-bis(2-t-butyl-6-methylphenol), and 2,2-bis(3,5-dimethyl-4-hydroxyphenyl)propane; ascorbic acid derivatives, such as 1-ascorbylpalmitate, ascorbylstearate; unsaturated aldehydes and ketones; and 3-pyrazolidinones such as 1-phenyl-3-pyraolidinone (phenidone) as described in *Research Disclosure*, June 1978, item 17029, and biphenyls such as 2,2'-dihydroxy-3,3'-di-t-butyl-5,5'-dimethylbiphenyl as described in European Laid Open Pat. Application No 0 059 740 A1.

As the visible image in black-and-white photothermographic elements is produced entirely by elemental silver (Ag°), one cannot readily decrease the amount of silver in the emulsion without reducing the maximum image density. However, reduction of the amount of silver is often desirable to reduce the cost of raw materials used in the emulsion and/or to enhance performance. For example, toning agents may be incorporated to improve the color of the silver image of the photothermographic element. Another method of increasing the maximum image density in photothermographic emulsions without increasing the amount of silver in the emulsion layer is by incorporating dye-forming or dye-releasing materials in the emulsion. Upon imaging, the dye-forming or dye-releasing material is oxidized, and a dye and a reduced silver image are simultaneously formed in the exposed region. In this way, a dye-enhanced silver image can be produced.

Thermographic imaging constructions (i.e., heat-developable materials) processed with heat, and without liquid development, are widely known in the imaging arts and rely on the use of heat to help produce an image. These elements generally comprise a support or substrate (such as paper, plastics, metals, glass, and the like) having coated thereon: (a) a thermally-sensitive, reducible silver source; (b) a reducing agent for the thermally-sensitive, reducible silver source (i.e., a developer); and (c) a binder.

In a typical thermographic construction, the image-forming layers are based on silver salts of long chain fatty acids. Typically, the preferred non-photosensitive reducible silver source is a silver salt of a long chain aliphatic carboxylic acid having from 10 to 30 carbon atoms. The silver salt of behenic acid or mixtures of acids of similar molecular weight are generally used. At elevated temperatures, silver behenate is reduced by a reducing agent for silver ion such as methyl gallate, hydroquinone, substituted-hydroquinones, hindered phenols, catechol, pyrogallol, ascorbic acid, ascorbic acid derivatives, and the like, whereby an image comprised of elemental silver is formed.

Many times, the thermographic construction is brought into contact with the thermal head of a thermographic recording apparatus, such as a thermal printer, thermal facsimile, and the like. In such instances, an anti-stick layer is coated on top of the imaging layer to prevent sticking of the thermographic construction to the thermal head of the apparatus utilized. The resulting thermographic construction is then heated to an elevated temperature, typically in the range of about 60°–225° C., resulting in the formation of an image.

The imaging arts have long recognized the fields of photothermography and thermography as being clearly distinct from that of photography. Photothermographic and thermographic elements significantly differ from conventional silver halide photographic elements which require wet-processing.

In photothermographic and thermographic imaging elements, a visible image is created by heat as a result of the reaction of a developer incorporated within the element. Heat is essential for development and temperatures of over 100° C. are routinely required. In contrast, conventional wet-processed photographic imaging elements require processing in aqueous processing baths to provide a visible image (e.g., developing and fixing baths) and development is usually performed at a more moderate temperature (e.g., 30°–50° C.).

In photothermographic elements only a small amount of silver halide is used to capture light and a different form of silver (e.g., silver behenate) is used to generate the image with heat. Thus, the silver halide serves as a catalyst for the development of the non-photosensitive, reducible silver source. In contrast, conventional wet-processed photographic elements use only one form of silver (e.g., silver halide) which, upon development, is convened to silver. Additionally, photothermographic elements require an amount of silver halide per unit area that is as little as one-hundredth of that used in a conventional wet-processed silver halide.

Photothermographic systems employ a light-insensitive silver salt, such as silver behenate, which participates with the developer in developing the latent image. In contrast, photographic systems do not employ a light-insensitive silver salt in the image-forming process. As a result, the image in photothermographic elements is produced primarily by reduction of the light-insensitive silver source (silver behenate) while the image in photographic black-and-white elements is produced primarily by the silver halide.

In photothermographic and thermographic elements, all of the "chemistry" of the system is incorporated within the element itself. For example, photothermographic and thermographic elements incorporate a developer (i.e., a reducing agent for the non-photosensitive reducible source of silver) within the element while conventional photographic elements do not. The incorporation of the developer into photothermographic elements can lead to increased formation of "fog" upon coating of photothermographic emulsions as compared to photographic emulsions. Even in so-called instant photography, developer chemistry is physically separated from the silver halide until development is desired. Much effort has gone into the preparation and manufacture of photothermographic and thermographic elements to minimize formation of fog upon coating, storage, and post-processing aging.

Similarly, in photothermographic elements, the unexposed silver halide inherently remains after development and the element must be stabilized against further development. In contrast, the silver halide is removed from photographic elements after development to prevent further imaging (i.e., the fixing step).

In photothermographic and thermographic elements the binder is capable of wide variation and a number of binders are useful in preparing these elements. In contrast, photographic elements are limited almost exclusively to hydrophillic colloidal binders such as gelatin.

Because photothermographic and thermographic elements require thermal processing, they pose different considerations and present distinctly different problems in manufacture and use. In addition, the effects of additives (e.g., stabilizers, antifoggants, speed enhancers, sensitizers, supersensitizers, etc.) which are intended to have a direct effect upon the imaging process can vary depending upon whether they have been incorporated in a photothermographic or thermographic element or incorporated in a photographic element.

Distinctions between photothermographic and photographic elements are described in *Imaging Processes and Materials* (Neblette's Eighth Edition); J. Sturge et al. Ed; Van Nostrand Reinhold: New York, 1989; Chapter 9 and in *Unconventional Imaging Processes*, E. Brinckman et al, Ed; The Focal Press: London and New York: 1978; pp. 74–75.

In photothermographic elements there exists the desire for products which exhibit increased contrast upon exposure to light and subsequent development. This desire is based upon the realization that contrast is directly related to the appearance of sharpness. Thus, products which exhibit increased contrast give the visual impression of enhanced sharpness.

Traditionally contrast has been defined by two methods, both of which are derived from the D-Log E curve. The first method is the determination of gamma, γ, which is defined as the slope of the straight-line section of the D-log E curve. The second is the determination of the overall sharpness of the toe section of the D-log E curve. By sharpness of the toe section, it is usually meant the relative density of the toe section. For instance, a sharp toe corresponds to a relatively low (small) toe density, and a soft toe corresponds to a relatively high (large) toe density. Generally, the point at which toe density is measured corresponds to 0.3 log E of the speed point, although toe density may be properly measured at any point prior to the curve's primary increase in slope. The speed point corresponds to the point on the D-log E curve where density equals 1.0.

If either the value of γ is high or the toe is sharp, then the image has a relatively high contrast. If the value of γ is low, or the toe is soft, the image has a relatively low contrast.

Hydrazides have been used in conventional wet processed black-and-white and color photographic systems. They have found use as nucleating agents, infectious developers, contrast, and speed improving agents, and color developing agents.

Hydrazides have been studied as infectious developers for use in photographic graphic arts films. See U.S. Pat. Nos. 4,798,790 and 4,925,832 and Kitchin, J. P. et al. *J. Photogr. Sci.* 1987, 35, 162–164 and Kitchin, J. P. et al. *J. Imag. Technol.* 1989, 15(6), 282–284. No sulfonyl hydrazide compounds were employed.

U.S. Pat. No. 4,902,599 describes the combination of hydrazine and a hydrazide, and also claims color image formation by a coupler-developer reaction although all the examples in this patent use a leuco dye to give a color image.

The use of sulfonyl hydrazides in photothermographic imaging appears unprecedented. Japanese Laid Open Pat. Publication No. JP 63-113455 describes the use of sulfonyl hydrazides attached to a pre-formed dye moiety in thermally developed photographic elements containing large amounts of photosensitive silver halide relative to non-photosensitive silver salts. Development of these materials takes place in an basic aqueous environment.

Sulfonyl hydrazides have been used in traditional dye diffusion transfer instant photography. G. J. Lestina; C. A. Bishop; R. J. Tuite; D. S. Daniel *Research Disclosure* 1974, 12822 describes the use of hydrazide dye-releasing compounds in color photography. Dye is released upon alkaline hydrolysis of the acylazo- or sulfonylazocompound generated upon exposure in the presence of AgX, a silver halide developing agent, and an electron transfer agent. U.S. Pat. No. 3,844,785 describes sulfonylhydrazides as dye forming compounds in a dye diffusion transfer photographic process. U.S. Pat. No. 4,386,150 uses dyes attached to hydrazides including sulfonyl hydrazides in a construction for instant photography. This construction requires aqueous alkaline processing.

The decomposition of sulfonyl-hydrazides has been studied by Golz, H; Glatz, B.; Haas, G.; Helmchen, G.; Muxfeldt, H. *Angew. Chetn. Int. Ed. Engl.* 1977, 16(10), 728–729. Low temperature oxidation with lead tetraacetate leads to the azo compound which can then undergo further decomposition by loss of nitrogen.

New developing agents for photothermographic systems are desired to provide improved sensitometric properties such as high contrast for very high quality imaging.

SUMMARY OF THE INVENTION

The present invention provides heat-developable, photothermographic and thermographic elements which are capable of providing high photospeed; stable, high density images with high resolution; good sharpness; high contrast; and good shelf stability. The possibility of low absorbance at 380 nm facilitates the use of the elements of this invention in graphic arts applications such as contact printing.

The heat-developable, photothermographic elements of the present invention comprise a support bearing at least one photosensitive, image-forming photothermographic emulsion layer comprising:

(a) a photosensitive silver halide;

(b) a non-photosensitive, reducible silver source;

(c) a reducing agent for the non-photosensitive, reducible silver source;

(d) a binder;

wherein the reducing agent comprises a compound having the formula:

$$R^1—CO—NHNH—SO_2R^2$$

wherein $R^1$ and $R^2$ may be each independently selected from the group consisting of alkyl and alkenyl groups of up to 20 carbon atoms, preferably of up to 10 carbon atoms, and more preferably of up to 5 carbon atoms; alkoxy groups of up to 20 carbon atoms, preferably of up to 10 carbon atoms, and more preferably of up to 5 carbon atoms; aryl, alkaryl, and aralkyl groups of up to 20 carbon atoms, preferably of up to 10 carbon atoms, and more preferably up to 6 carbon atoms; aryloxy groups of up to 20 carbon atoms, preferably of up to 10 carbon atoms, and more preferably of up to 6 carbon atoms; non-aromatic and aromatic heterocyclic ring groups containing up to 6 ring atoms; alicyclic ring groups containing up to 6 ring carbon atoms; and fused ring and bridging groups comprising up to 14 ring atoms.

The photothermographic element may optionally further comprise an electron transfer agent as disclosed later herein.

The present invention also provides a process for the formation of a visible image by first exposing to electromagnetic radiation and thereafter heating the inventive photothermographic element described earlier herein.

The present invention also provides a process comprising the steps of:

(a) exposing the inventive photothermographic element described earlier herein to electromagnetic radiation, to which the silver halide grains of the element are sensitive, to generate a latent image;

(b) heating the exposed element to develop the latent image into a visible image;

(c) positioning the element with a visible image thereon between a source of ultraviolet radiation energy and an ultraviolet radiation photosensitive imageable medium; and (d) thereafter exposing the imageable medium to ultraviolet radiation through the visible image on the element, thereby absorbing ultraviolet radiation in the areas of the element where there is a visible image and transmitting ultraviolet radiation through areas of the element where there is no visible image.

The photothermographic element may be exposed in step a) with visible, infrared, or laser radiation.

The heat-developable, thermographic elements of the present invention comprise a support bearing at least one heat-sensitive, thermographic emulsion layer comprising:

(a) a non-photosensitive, reducible silver source;

(b) a reducing agent for the non-photosensitive, reducible silver source;

(c) a binder;

wherein the reducing agent comprises a compound having the formula:

$R^1—CO—NHNH—SO_2R^2$ wherein $R^1$ and $R^2$ may be each independently selected from the group consisting of alkyl and alkenyl groups of up to 20 carbon atoms, preferably alkyl and alkenyl of up to 10 carbon atoms, more preferably alkyl and alkenyl groups of up to 5 carbon atoms; alkoxy groups of up to 20 carbon atoms, preferably of up to 10 carbon atoms, and more preferably of up to 5 carbon atoms; aryl, alkaryl, and aralkyl groups of up to 20 carbon atoms, preferably of up to 10 carbon atoms, and more preferably up to 6 carbon atoms; aryloxy groups of up to 20 carbon atoms, preferably of up to 10 carbon atoms, and more preferably of up to 6 carbon atoms; non-aromatic and aromatic heterocyclic ring groups containing up to 6 ring atoms; alicyclic ring groups comprising up to 6 ring carbon atoms; and fused ring and bridging groups comprising up to 14 ring atoms.

The thermographic element may optionally further comprise an electron transfer agent as disclosed later herein.

The present invention also provides a process for the formation of a visible image by heating the inventive thermographic element described earlier herein.

The present invention further provides a process comprising the steps of:

(a) heating the inventive thermographic element described earlier herein at a temperature sufficient to generate a visible image thereon;

(b) positioning the thermographic element with a visible image thereon between a source of ultraviolet radiation and an ultraviolet radiation photosensitive imageable medium, and (c) thereafter exposing the imageable medium to ultraviolet radiation through the visible image on the element, thereby absorbing ultraviolet radiation in the areas of the element where there is a visible image and transmitting ultraviolet radiation through areas of the element where there is no visible image.

The sulfonyl hydrazide reducing agents (i.e., developers) used in this invention provide a significant improvement in image contrast when compared to photothermographic elements incorporating known developers or other hydrazide materials.

The use of sulfonyl hydrazides in photothermographic and thermographic imaging elements also provides black-and-white images.

When the photothermographic element used in this invention is heat developed, preferably at a temperature of from about 80° C. to about 250° C. (176° F. to 482° F.) for a duration of from about 1 second to about 2 minutes, in a substantially water-free condition after, or simultaneously with, imagewise exposure, a black-and-white silver image either in exposed areas or in unexposed areas with exposed photosensitive silver halide is obtained.

The term "substantially water-free condition" means that the reaction system is in approximate equilibrium with water in the air, and water for inducing or promoting the reaction is not added to the element. Such a condition is described in T. H. James, *The Theory of the Photographic Process*, Fourth Edition, page 374.

As used herein, the term "emulsion layer" means a layer of a photothermographic or thermographic element that contains the light-insensitive silver source material and the photosensitive silver salt (when used).

As used herein the term "photothermographic element" means a construction comprising at least one photothermographic emulsion layer and any support, topcoat layers, antihalation layers, blocking layers, etc.

As used herein the term "thermographic element" means a construction comprising at least one thermographic emulsion layer and any support, topcoat layers, antihalation layers, blocking layers, etc.

For purposes of this invention the ultraviolet region of the spectrum is defined as that region of the spectrum below 400 nm, preferably from 100 nm to 400 nm. More preferably, the ultraviolet region of the spectrum is the region between 190 nm and 400 nm.

For the purposes of this invention the infrared region of the spectrum is defined as 750–1400 nm, the visible region of the spectrum is defined as 400–750 nm, and the red region of the spectrum is defined as 640–750 nm. Preferably the red region of the spectrum is 650–700 nm.

As is well understood in this area, substitution is not only tolerated, but is often advisable and substitution is anticipated on the compounds used in the present invention. As a means of simplifying the discussion and recitation of certain substituent groups, the terms "group" and "moiety" are used to differentiate between those chemical species that may be substituted and those which may not be so substituted. Thus, when the term "group," or "aryl group," is used to describe a substituent, that substituent includes the use of additional substituents beyond the literal definition of the basic group. Where the term "moiety" is used to describe a substituent, only the unsubstituted group is intended to be included. For example, the phrase, "alkyl group" is intended to include not only pure hydrocarbon alkyl chains, such as methyl, ethyl, propyl, t-butyl, cyclohexyl, iso-octyl, octadecyl and the like, but also alkyl chains bearing substituents known in the art, such as hydroxyl, alkoxy, phenyl, halogen atoms (F, Cl, Br, and I), cyano, nitro, amino, carboxy, etc. For example, alkyl group includes ether groups (e.g., $CH_3—CH_2—CH_2—O—CH_2—$), haloalkyls, nitroalkyls, carboxyalkyls, hydroxyalkyls, sulfoalkyls, etc. On the other hand, the phrase "alkyl moiety" is limited to the inclusion of only pure hydrocarbon alkyl chains, such as methyl, ethyl, propyl, t-butyl, cyclohexyl, iso-octyl, octadecyl, and the like. Substituents that react with active ingredients, such as very strongly electrophilic or oxidizing substituents, would of course be excluded by the ordinarily skilled artisan as not being inert or harmless.

Other aspects, advantages, and benefits of the present invention are apparent from the detailed description, examples, and claims.

DETAILED DESCRIPTION OF THE INVENTION

Sulfonyl hydrazides have been shown to increase the contrast and image density when used as a developer in photothermographic and thermographic formulations. They improve contrast and image density which allows a significant reduction in coating weight.

The present invention provides heat-developable, photothermographic elements capable of providing stable, high density images of high resolution and high contrast. These heat-developable, photothermographic elements comprise a support bearing at least one photothermographic emulsion layer comprising:

(a) a photosensitive silver halide;

(b) a non-photosensitive, reducible silver source;

(c) a reducing agent for the non-photosensitive, reducible silver source; and (d) a binder;

wherein the reducing agent comprises a compound having the formula:

$$R^1—CO—NHNH—SO_2R^2$$

wherein $R^1$ and $R^2$ may be each independently selected from the group consisting of alkyl and alkenyl groups of up to 20 carbon atoms, preferably of up to 10 carbon atoms, more preferably of up to 5 carbon atoms; alkoxy groups of up to 20 carbon atoms, preferably of up to 10 carbon atoms, and more preferably of up to 5 carbon atoms; aryl, alkaryl, and aralkyl groups of up to 20 carbon atoms, preferably of up to 10 carbon atoms, and more preferably up to 6 carbon atoms; aryloxy groups of up to 20 carbon atoms, preferably of up to 10 carbon atoms, and more preferably of up to 6 carbon atoms; non-aromatic and aromatic heterocyclic ring groups containing up to 6 ring atoms; alicyclic ring groups containing up to 6 ring carbon atoms; and fused ring and bridging groups containing up to 14 ring atoms.

The present invention also provides a heat-developable, thermographic element comprising a support bearing at least one thermographic emulsion layer comprising:

(a) a non-photosensitive, reducible silver source;

(b) a reducing agent for the non-photosensitive, reducible silver source;

(c) a binder;

wherein the reducing agent comprises a compound having the formula:

$$R^1—CO—NHNH—SO_2R^2$$

wherein $R^1$ and $R^2$ may be each independently selected from the group consisting of alkyl and alkenyl groups of up to 20 carbon atoms, preferably alkyl and alkenyl of up to 10 carbon atoms, more preferably alkyl and alkenyl groups Of up to 5 carbon atoms; alkoxy groups of up to 20 carbon atoms, preferably of up to 10 carbon atoms, and more preferably of up to 5 carbon atoms; aryl, alkaryl, and aralkyl groups of up to 20 carbon atoms, preferably of up to 10 carbon atoms, and more preferably up to 6 carbon atoms; aryloxy groups of up to 20 carbon atoms, preferably of up to 10 carbon atoms, and more preferably of up to 6 carbon atoms; non-aromatic and aromatic heterocyclic ring groups containing up to 6 ring atoms; alicyclic ring groups comprising up to 6 ring carbon atoms; and fused ring and bridging groups comprising up to 14 ring atoms.

Representative $R^1$ and/or $R^2$ groups useful in the present invention are shown below. These representations are exemplary and are not intended to be limiting.

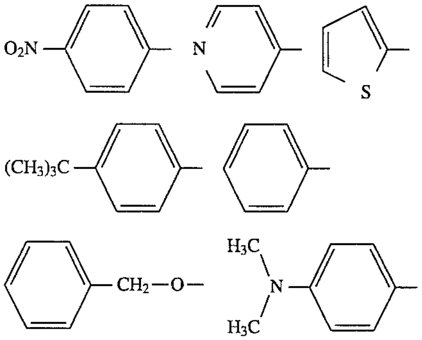

-continued

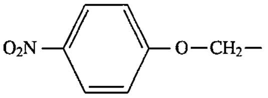

$(CH_3)_3C—O—$

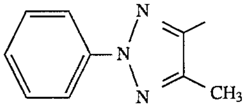

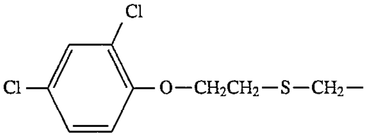

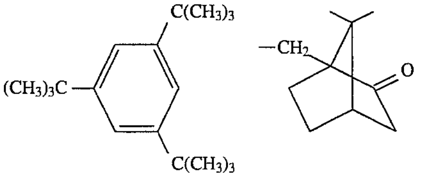

$HO-(CH_2)_3-$

Sulfonyl hydrazides

Sulfonyl hydrazides may be prepared by the reaction of a solution of an acyl hydrazide with a sulfonyl chloride in a pyridine solution. This procedure is described in Ito, S.; Tanaka, Y.; Kakehi A. *Bull. Chem. Soc. Japan* 1976, 49, 762.

$$R^1—CO—NHNH_2+Cl—SO_2R^2 \rightarrow R^1—CO—NHNH—SO_2R^2$$

Representative sulfonyl hydrazide developer compounds used in the present invention are shown below. These representations are exemplary and are not intended to be limiting.

Sulfonyl Hydrazide Developer 1

$CH_3(CH_2)_{10}-CO-NHNH-SO_2-CH_3$

Sulfonyl Hydrazide Developer 2

$CH_3(CH_2)_6-CO-NHNH-SO_2-(CH_2)_{15}CH_3$

Sulfonyl Hydrazide Developer 3

$C_6H_5-CH_2-CO-NHNH-SO_2-C_6H_4\text{-p-}CH_3$

Sulfonyl Hydrazide Developer 4

$CH_3(CH_2)_6-CO-NHNH-SO_2-C_6H_4\text{-p-}CH_3$

Sulfonyl Hydrazide Developer 5

$C_6H_5-O-CO-NHNH-SO_2-C_6H_4\text{-p-}CH_3$

Sulfonyl Hydrazide Developer 6

$(CH_3)_3C-CO-NHNH-SO_2-C_6H_4\text{-p-}CH_3$

Sulfonyl Hydrazide Developer 7

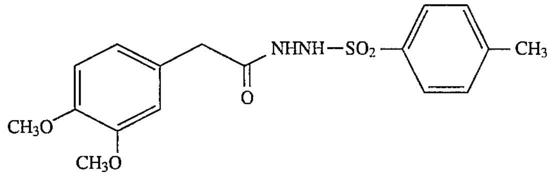

Sulfonyl Hydrazide Developer 8

-continued

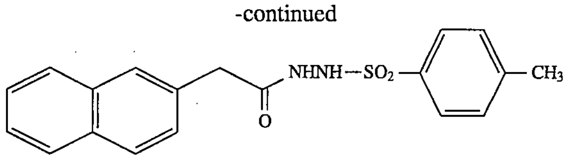

Sulfonyl Hydrazide Developer 9

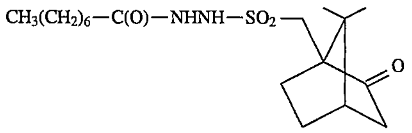

Sulfonyl Hydrazide Developer 10

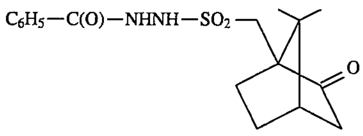

Sulfonyl Hydrazide Developer 11

$p\text{-}HO-C_6H_4-(CH_2)_2-CO-NHNH-SO_2-C_6H_4\text{-}p\text{-}CH_3$

Sulfonyl Hydrazide Developer 12

$C_6H_5-CO-NHNH-SO_2-C_6H_4\text{-}p\text{-}CH_3$

The photothermographic elements of this invention may be used to prepare black-and-white images. The photothermographic material of this invention can be used, for example, in conventional black-and-white photothermography, in electronically generated black-and-white hardcopy recording, in the graphic arts area, and in digital proofing. The material of this invention provides high photospeed, provides strongly absorbing black-and-white images, and provides a dry and rapid process.

In photothermographic elements of the present invention, the layer(s) that contain the photographic silver salt are referred to herein as emulsion layer(s). According to the present invention, the reducing agent is added either to one or more emulsion layers or to a layer or layers adjacent to one or more emulsion layers. Layers that are adjacent to emulsion layers may be, for example, protective topcoat layers, primer layers, interlayers, opacifying layers, antihalation layers, barrier layers, auxiliary layers, etc. It is preferred that the reducing agent be present in the photothermographic emulsion layer or topcoat layer.

In thermographic elements of the present invention, the layer(s) that contain the non-photosensitive reducible silver source are referred to herein as thermographic layer(s). When used in thermographic elements according to the present invention, the reducing agent is added either to the layer that contains the non-photosensitive reducible silver source or to one or more layers adjacent to the layer that contains the non-photosensitive reducible silver source. Such layers may be, for example, protective topcoat layers, primer layers, interlayers, opacifying layers, barrier layers, auxiliary layers, etc. It is preferred that the reducing agent be present in the thermographic layer or topcoat layer.

The reducing agent should be present as 1 to 10% by weight of the imaging layer. In multilayer constructions, if the reducing agent is added to a layer other than an emulsion layer, slightly higher proportions, of from about 2 to 15 wt %, tend to be more desirable.

The amounts of the above-described reducing agents that are added to the photothermographic element of the present invention may be varied depending upon the particular compound used, upon the type of emulsion layer, and whether the reducing agent is located in the emulsion layer or topcoat layer. However, the ingredients are preferably added in an amount of 0.01 to 100 mole per mole of silver halide, and more preferably, from 0.1 to 50 mole per mole of silver halide, in the emulsion layer.

Photothermographic elements of the invention may also contain other additives such as shelf-life stabilizers, toners, development accelerators, post-processing stabilizers or stabilizer precursors, and other image-modifying agents.

The Photosensitive Silver Halide

As noted above, when used in a photothermographic element, the present invention includes a photosensitive silver halide in the photothermographic construction. The photosensitive silver halide can be any photosensitive silver halide such as silver bromide, silver iodide, silver chloride, silver bromoiodide, silver chlorobromoiodide, silver chlorobromide, etc. The photosensitive silver halide can be added to the emulsion layer in any fashion so long as it is placed in catalytic proximity to the organic silver compound which serves as a source of reducible silver.

The silver halide may be in any form which is photosensitive including, but not limited to cubic, octahedral, rhombic, dodecahedral, orthorhombic, tetrahedral, tabular, other polyhedral habits, etc. and may have epitaxial growth of crystals thereon. The silver halide grains may have a uniform ratio of halide throughout; they may have a graded halide content, with a continuously varying ratio of, for example, silver bromide and silver iodide; or they may be of the core-shell-type, having a discrete core of one halide ratio, and a discrete shell of another halide ratio. Core-shell type silver halide grains useful in photothermographic elements and methods of preparing these materials are described in copending U.S. patent application Ser. No. 08/199,114 (filed Feb. 22, 1994). A core-shell silver halide grain having an iridium doped core is particularly preferred. Iridium doped core-shell grains of this type are described in copending U.S. patent application Ser. No. 08/239,984 (filed May 9, 1994).

The silver halide may be prepared ex situ, that is it may be "pre-formed" and mixed with the organic silver salt in a binder prior to use to prepare a coating solution. Materials of this type are often referred to as "pre-formed emulsions." The silver halide may be pre-formed by any means, e.g., in accordance with U.S. Pat. No. 3,839,049. Methods of preparing these silver halide and organic silver salts and manners of blending them are described in *Research Disclosure*, June 1978, item 17029; U.S. Pat. Nos. 3,700,458 and 4,076,539; and Japanese Patent Application Nos. 13224/74, 42529/76, and 17216/75. For example, it is effective to blend the silver halide and organic silver salt using a homogenizer for a long period of time.

Pre-formed silver halide emulsions when used in the material of this invention can be unwashed or washed to remove soluble salts. In the latter case the soluble salts can be removed by chill-setting and leaching or the emulsion can be coagulation washed, e.g., by the procedures described in U.S. Pat. Nos. 2,618,556; 2,614,928; 2,565,418; 3,241,969; and 2,489,341. The pre-formed silver halide grains may have any crystalline habit including, but not limited to, cubic, tetrahedral, orthorhombic, tabular, laminar, platelet, etc.

It is also effective to use an in situ process, i.e., a process in which a halogen-containing compound is added to an organic silver salt to partially convert the silver of the organic silver salt to silver halide.

The light sensitive silver halide used in the present invention can be employed in a range of about 0.005 mole to about 0.5 mole, preferably from about 0.01 mole to about 0.15 mole, and more preferably from about 0.03 to 0.12 mole per mole of non-photosensitive reducible silver salt.

The silver halide used in the present invention may be chemically and spectrally sensitized in a manner similar to that used to sensitize conventional wet process silver halide or state-of-the-art heat-developable photographic materials. For example, it may be chemically sensitized with a chemical sensitizing agent, such as a compound containing sulfur, selenium, tellurium, etc., or a compound containing gold, platinum, palladium, ruthenium, rhodium, iridium, etc., a reducing agent such as a tin halide, etc., or a combination thereof. The details of these procedures are described in T. H. James *The Theory of the Photographic Process*, Fourth Edition, Chapter 5, pages 149 to 169. Suitable chemical sensitization procedures are also described in Shepard, U.S. Pat. No. 1,623,499; Waller, U.S. Pat. No. 2,399,083; McVeigh, U.S. Pat. No. 3,297,447; and Dunn, U.S. Pat. No. 3,297,446.

The photosensitive silver halides may be spectrally sensitized with various known dyes that spectrally sensitize silver halide. Non-limiting examples of sensitizing dyes that can be employed include cyanine dyes, merocyanine dyes, complex cyanine dyes, complex merocyanine dyes, holopolar cyanine dyes, hemicyanine dyes, styryl dyes, and hemioxanol dyes. Of these dyes, cyanine dyes, merocyanine dyes, and complex merocyanine dyes are particularly useful.

An appropriate amount of sensitizing dye added is generally about $10^{-10}$ to $10^{-1}$ mole, and preferably about $10^{-8}$ to $10^{-3}$ moles per mole of silver halide.

The Non-Photosensitive Reducible Silver Source Material

When used in photothermographic and thermographic elements, the present invention includes a non-photosensitive reducible silver source. The non-photosensitive reducible silver source that can be used in the present invention can be any material that contains a source of reducible silver ions. Preferably, it is a silver salt which is comparatively stable to light and forms a silver image when heated to 80° C. or higher in the presence of an exposed photocatalyst (such as silver halide) and a reducing agent. Salts of organic acids, such as the silver salt of behenic acid, or other salts of organic materials, such as silver imidazolates, have been proposed, and U.S. Pat. No. 4,260,677 discloses the use of complexes of inorganic or organic silver salts as non-photosensitive, reducible silver sources. Complexes of organic or inorganic silver salts, wherein the ligand has a gross stability constant for silver ion of about 4.0–10.0, are also useful in this invention.

Silver salts of organic acids, particularly silver salts of long chain fatty carboxylic acids, are preferred. The chains typically contain 10 to 30, preferably 15 to 28, carbon atoms. Suitable organic silver salts include silver salts of organic compounds having a carboxyl group. Examples thereof include a silver salt of an aliphatic carboxylic acid and a silver salt of an aromatic carboxylic acid. Preferred examples of the silver salts of aliphatic carboxylic acids include silver behenate, silver stearate, silver oleate, silver laureate, silver caprate, silver myristate, silver palmitate, silver maleate, silver fumarate, silver tartarate, silver furoate, silver linoleate, silver butyrate, silver camphorate, and mixtures thereof, etc. Silver salts that can be substituted with a halogen atom or a hydroxyl group also can be effectively used. Preferred examples of the silver salts of aromatic carboxylic acid and other carboxyl group-containing compounds include: silver benzoate, a silver-substituted benzoate, such as silver 3,5-dihydroxybenzoate, silver o-methylbenzoate, silver m-methylbenzoate, silver p-methylbenzoate, silver 2,4-dichlorobenzoate, silver acetamidobenzoate, silver p-phenylbenzoate, etc.; silver gallate; silver tannate; silver phthalate; silver terephthalate; silver salicylate; silver phenylacetate; silver pyromellilate; a silver salt of 3-carboxymethyl-4-methyl-4-thiazoline-2-thione or the like as described in U.S. Pat. No. 3,785,830; and a silver salt of an aliphatic carboxylic acid containing a thioether group as described in U.S. Pat. No. 3,330,663.

Silver salts of compounds containing mercapto or thione groups and derivatives thereof can also be used. Preferred examples of these compounds include: a silver salt of 3-mercapto-4-phenyl-1,2,4-triazole; a silver salt of 2-mercaptobenzimidazole; a silver salt of 2-mercapto-5-aminothiadiazole; a silver salt of 2-(2-ethylglycolamido)benzothiazole; a silver salt of thioglycolic acid, such as a silver salt of a S-alkylthioglycolic acid (wherein the alkyl group has from 12 to 22 carbon atoms); a silver salt of a dithiocarboxylic acid such as a silver salt of dithioacetic acid; a silver salt of thioamide; a silver salt of 5-carboxylic-1-methyl- 2-phenyl-4-thiopyridine; a silver salt of mercaptotriazine; a silver salt of 2-mercapto-benzoxazole; a silver salt as described in U.S. Pat. No. 4,123,274, for example, a silver salt of a 1,2,4-mercaptothiazole derivative, such as a silver salt of 3-amino-5-benzylthio-1,2,4-thiazole; and a silver salt of a thione compound, such as a silver salt of 3-(2-carboxyethyl)-4-methyl-4-thiazoline-2-thione as disclosed in U.S. Pat. No. 3,201,678.

Furthermore, a silver salt of a compound containing an imino group can be used. Preferred examples of these compounds include: silver salts of benzotriazole and substituted derivatives thereof, for example silver methylbenzotriazole and silver 5-chlorobenzotriazole, etc.; silver salts of 1,2,4-triazoles or 1-H-tetrazoles as described in U.S. Pat. No. 4,220,709; and silver salts of imidazoles and imidazole derivatives.

Silver salts of acetylenes can also be used. Silver acetylides are described in U.S. Pat. Nos. 4,761,361 and 4,775,613.

It is also found convenient to use silver half soaps. A preferred example of a silver half soap is an equimolar blend of silver behenate and behenic acid, which analyzes for about 14.5% silver and which is prepared by precipitation from an aqueous solution of the sodium salt of commercial behenic acid.

Transparent sheet materials made on transparent film backing require a transparent coating. For this purpose a silver behenate full soap, containing not more than about 15 percent of free behenic acid and analyzing about 22 percent silver, can be used.

The method used for making silver soap emulsions is well known in the art and is disclosed in *Research Disclosure*, April 1983, item 22812; *Research Disclosure*, October 1983, item 23419; and U.S. Pat. No. 3,985,565.

The silver halide and the non-photosensitive reducible silver source material that form a starting point of development should be in catalytic proximity, i.e., reactive association. By "catalytic proximity" or "reactive association" is meant that they should be in the same layer, in adjacent layers, or in layers separated from each other by an intermediate layer having a thickness of less than 1 micrometer (1 μm). It is preferred that the silver halide and the non-photosensitive reducible silver source material be present in the same layer.

Photothermographic emulsions containing pre-formed silver halide can be sensitized with chemical sensitizers, or with spectral sensitizers as described above.

The source of reducible silver material generally constitutes about 5 to about 70 percent by weight of the emulsion layer. It is preferably present at a level of about 10 to about 50 percent by weight of the emulsion layer.

The Binder

The photosensitive silver halide (when used), the non-photosensitive reducible source of silver, the sulfonyl hydrazide reducing agent, stabilizers, acutance dyes, antifoggants, and other addenda used in the present invention are generally added to at least one binder.

The binder(s) that can be used in the present invention can be employed individually or in combination with one another. It is preferred that the binder be selected from polymeric materials, such as, for example, natural and synthetic resins that are sufficiently polar to hold the other ingredients in solution or suspension.

A typical hydrophilic binder is a transparent or translucent hydrophilic colloid. Examples of hydrophilic binders include: a natural substance, for example, a protein such as gelatin, a gelatin derivative, a cellulose derivative, etc.; a polysaccharide such as starch, gum arabic, pullulan, dextrin, etc.; and a synthetic polymer, for example, a water-soluble polyvinyl compound such as polyvinyl alcohol, polyvinyl pyrrolidone, acrylamide polymer, etc. Another example of a hydrophilic binder is a dispersed vinyl compound in latex form which is used for the purpose of increasing dimensional stability of a photographic element.

Examples of typical hydrophobic binders are polyvinyl acetals, polyvinyl chloride, polyvinyl acetate, cellulose acetate, polyolefins, polyesters, polystyrene, polyacrylonitrile, polycarbonates, methacrylate copolymers, maleic anhydride ester copolymers, butadiene-styrene copolymers, and the like. Copolymers, e.g., terpolymers, are also included in the definition of polymers. The polyvinyl acetals, such as polyvinyl butyral and polyvinyl formal, and vinyl copolymers such as polyvinyl acetate and polyvinyl chloride are particularly preferred.

Although the binder can be hydrophilic or hydrophobic, preferably it is hydrophobic in the silver containing layer. Optionally, these polymers may be used in combination of two or more thereof.

The binders are preferably used at a level of about 30–90 percent by weight of the emulsion layer, and more preferably at a level of about 45–85 percent by weight. Where the proportions and activities of the reducing agent for the non-photosensitive reducible source of silver require a particular developing time and temperature, the binder should be able to withstand those conditions. Generally, it is preferred that the binder not decompose or lose its structural integrity at 250° F. (121° C.) for 60 seconds, and more preferred that it not decompose or lose its structural integrity at 350° F. (177° C.) for 60 seconds.

The polymer binder is used in an amount sufficient to carry the components dispersed therein, that is, within the effective range of the action as the binder. The effective range can be appropriately determined by one skilled in the art.

Electron Transfer Agents

An electron transfer agent optionally may be used to advantage in the photothermographic elements of the present invention. Electron transfer agents are compounds that are capable of being oxidized by the silver halide to form a species which has the ability to then oxidize the hydrazide reducing agent. In this process the electron transfer agent is regenerated and is capable of again being oxidized by the silver halide. Thus, the electron transfer agent acts as a catalytic shuttle for oxidation of the sulfonyl hydrazide reducing agent and reduction of the photosensitive silver halide to latent image silver specs to a critical number necessary for physical development of the non-photosensitive silver soap or reduction of the reducible silver source by the sulfonyl hydrazide reducing agent. Preferably the electron transfer agent is mobile under the conditions of thermal development. When added to the emulsion layer in the absence of a reducing agent, however, the electron transfer agent does not function as a developer and no silver image is obtained. Electron transfer agents are added in catalytic amounts relative to the silver halide or reducing agent.

The electron transfer agent may be added to the emulsion layer in an amount of from 0.000 1 to 1 mole per mole of silver halide, more preferably in the amount of from 0.001 to 0.1 mole per mole of silver halide.

Examples of suitable electron transfer agents are hydroquinone; substituted-hydroquinones such as alkyl-substituted hydroquinones, such as t-butylhyroquinone and 2,5-dimethylhydroquinone, halogen-substituted hydroquinones such as chlorohydroquinone and dichlorohydroquinone, alkoxy-substituted hydroquinones such as methoxyhydroquinone; polyhydroxybenzene derivatives such as methylhydroxynaphthalene; catechols; pyrogallols, such as methyl gallate; ascorbic acid and ascorbic acid derivatives; hydroxylamines such as N,N'-di(2-ethoxyethyl)hydroxylamine; aminophenols; phenylenediamines; and pyrazolidinones. Other suitable electron transfer agents are disclosed in U.S. Pat. Nos. 5,139,919 and 5,156,939. Preferred electron transfer agents are pyrazolidinones and hydroquinones.

Photothermographic and Thermographic Formulations

The formulation for the photothermographic and thermographic emulsion layer can be prepared by dissolving and dispersing the binder, the photosensitive silver halide (when used), the non-photosensitive reducible source of silver, the sulfonyl hydrazide reducing agent for the non-photosensitive reducible silver source, and optional additives, in an inert organic solvent, such as, for example, toluene, 2-butanone, or tetrahydrofuran.

The use of "toners" or derivatives thereof which improve the image, is highly desirable, but is not essential to the element. Toners may be present in amounts of from 0.01 to 10 percent by weight of the emulsion layer, preferably from 0.1 to 10 percent by weight. Toners are well known materials in the photothermographic art as shown in U.S. Pat. Nos. 3,080,254; 3,847,612; and 4,123,282.

Examples of toners include: phthalimide and N-hydroxyphthalimide; cyclic imides, such as succinimide, pyrazoline-5-ones, quinazolinone, 1-phenylurazole, 3-phenyl-2-pyrazoline-5-one, and 2,4-thiazolidinedione; naphthalimides, such as N-hydroxy-1,8-naphthalimide; cobalt complexes, such as cobaltic hexamine trifluoroacetate; mercaptans such as 3-mercapto-1,2,4-triazole, 2,4-dimercaptopyrimidine, 3-mercapto-4,5-diphenyl-1,2,4-triazole and 2,5-dimercapto-1,3,4-thiadiazole; N-(aminomethyl)aryldicarboximides, such as (N,N -dimethylaminomethyl)phthalimide, and N-(dimethylaminomethyl)naphthalene-2,3-dicarboximide; a combination of blocked pyrazoles, isothiuronium derivatives, and certain photobleach agents, such as a combination of N,N'-hexamethylene-bis(1-carbamoyl-3,5-dimethylpyrazole), 1,8-(3,6-diazaoctane)bis(isothiuronium)trilhoroacetate, and 2-(tribromomethylsulfonyl benzothiazole); merocyanine dyes such as 3-ethyl-5-[(3-ethyl-2-benzothiazolinylidene)-1-methyl-ethylidene]-2-thio-2,4-o-azolidinedione; phthalazinone, phthalazinone derivatives, or metal salts or these derivatives, such as 4-(1-naphthyl)phthalazinone, 6-chlorophthalazinone, 5,7-dimethoxyphthalazinone, and 2,3-dihydro-1,4-phthalazinedione; phthalazine, a combination of phthalazine plus one or more phthalic acid derivatives, such as phthalic acid, 4-methylphthalic acid, 4-nitrophthalic acid, and tetrachlorophthalic anhydride, quinazolinediones, benzoxazine or naphthoxazine derivatives; rhodium complexes functioning not only as tone modifiers but also as sources of halide ion for silver halide formation in situ, such as ammonium hexachlororhodate (III), rhodium bromide, rhodium nitrate, and potassium hexachlororhodate (III); inorganic peroxides and persulfates, such as ammonium peroxydisulfate and hydrogen peroxide; benzoxazine-2,4-diones, such as 1,3-benzoxazine-2,4-dione, 8-methyl-1,3-benzoxazine-2,4-dione, and 6-nitro-1,3-benzoxazine-2,4-dione; pyrimidines and asym-triazines, such as 2,4-dihydroxypyrimidine, 2-hydroxy-4-aminopyrimidine, and azauracil; and tetrazapentalene derivatives, such as 3,6-dimercapto-1,4-diphenyl-1H,4H-2,3a,5,6a-tetraazapentalene and 1,4-di-(o-chlorophenyl)- 3,6-dimercapto-1H,4H-2,3a,5,6a-tetraazapentalene.

When used in photothermographic elements, the photothermographic elements used in this invention may be further protected against the additional production of fog and can be stabilized against loss of sensitivity during keeping. While not necessary for the practice of the invention, it may be advantageous to add mercury (II) salts to the emulsion layer(s) as an antifoggant. Preferred mercury (II) salts for this purpose am mercuric acetate and mercuric bromide.

Other suitable antifoggants and stabilizers, which can be used alone or in combination, include the thiazolium salts described in U.S. Pat. Nos. 2,131,038 and 2,694,716; the azaindenes described in U.S. Pat. Nos. 2,886,437 and 2,444,605; the mercury salts described in U.S. Pat. No. 2,728,663; the urazoles described in U.S. Pat. No. 3,287,135; the sulfocatechols described in U.S. Pat. No. 3,235,652; the oximes described in British Pat. No. 623,448; the polyvalent metal salts described in U.S. Pat. No. 2,839,405; the thiuronium salts described in U.S. Pat. No. 3,220,839; and palladium, platinum and gold salts described in U.S. Pat. Nos. 2,566,263 and 2,597,915.

Photothermographic and thermographic elements of the invention may contain plasticizers and lubricants such as polyalcohols, e.g., glycerin and diols of the type described in U.S. Pat. No. 2,960,404; fatty acids or esters such as those described in U.S. Pat. Nos. 2,588,765 and 3,121,060; and silicone resins such as those described in British Pat. No. 955,061.

Photothermographic elements according to the present invention can further contain light-absorbing materials, antihalation, acutance, and filter dyes such as those described in U.S. Pat. Nos. 3,253,921; 2,274,782; 2,527,583; 2,956,879; 5,266,452; and 5,314,795. If desired, the dyes can be mordanted, for example, as described in U.S. Pat. No. 3,282,699.

Photothermographic and thermographic elements containing emulsion layers described herein may contain matting agents such as starch, titanium dioxide, zinc oxide, silica, and polymeric beads including beads of the type described in U.S. Pat. Nos. 2,992,101 and 2,701,245.

Emulsions in accordance with this invention may be used in photothermographic and thermographic elements which contain antistatic or conducting layers, such as layers that comprise soluble salts, e.g., chlorides, nitrates, etc., evaporated metal layers, ionic polymers such as those described in U.S. Pat. Nos. 2,861,056, and 3,206,312 or insoluble inorganic salts such as those described in U.S. Pat. No. 3,428,451.

Photothermographic and Thermographic Constructions

The photothermographic and thermographic elements of this invention may be constructed of one or more layers on a support (often referred to as a substrate or film base). Single layer constructions should contain the silver halide (when used), the non-reducible silver source material, the sulfonyl hydrazide reducing agent (i.e., the developer), and binder as well as optional materials such as toners, dye-forming materials, coating aids, and other adjuvants. Two-layer constructions should contain silver halide (when used) and non-reducible silver source in one emulsion layer (usually the layer adjacent to the support) and some of the other ingredients in the second layer or both layers, although two layer constructions comprising a single emulsion layer coating containing all the ingredients and a protective topcoat are envisioned.

Photothermographic and thermographic emulsions used in this invention can be coated by various coating procedures including wire wound rod coating, dip coating, air knife coating, curtain coating, or extrusion coating using hoppers of the type described in U.S. Pat. No. 2,681,294. If desired, two or more layers may be coated simultaneously by the procedures described in U.S. Pat. No. 2,761,791 and British Pat. No. 837,095. Typical wet thickness of the emulsion layer can range from about 10 to about 100 micrometers (μm), and the layer can be dried in forced air at temperatures ranging from 20° C. to 100° C. It is preferred that the thickness of the layer be selected to provide maximum image densities greater than 0.2, and, more preferably, in the range 0.5 to 2.5, as measured by a MacBeth Color Densitometer Model TD 504 using the color filter complementary to the dye color.

Photothermographic and thermographic emulsions used in the invention can be coated on a wide variety of supports. The support can be selected from a wide range of materials depending on the imaging requirement. Supports may be transparent or opaque. Typical supports include polyester film, subbed polyester film, polyethylene terephthalate film, cellulose nitrate film, cellulose ester film, polyvinyl acetal film, polycarbonate film and related or resinous materials, as well as glass, paper, metal and the like. Typically, a flexible support is employed, especially a paper support, which can be partially acetylated or coated with baryta and/or an α-olefin polymer, particularly a polymer of an alpha-olefin containing 2 to 10 carbon atoms such as polyethylene, polypropylene, ethylene-butene copolymers, and the like. Preferred polymeric materials for the support include polymers having good heat stability, such as polyesters. A particularly preferred polyester is polyethylene terephthalate.

Additionally, it may be desirable in some instances to coat different emulsion layers on both sides of a transparent support, especially when it is desirable to isolate the imaging chemistries of the different emulsion layers.

Barrier layers, preferably comprising a polymeric material, may also be present in the photothermographic element of the present invention. Polymers for the material of the barrier layer can be selected from natural and synthetic polymers such as gelatin, polyvinyl alcohols, polyacrylic acids, sulfonated polystyrene, and the like. The polymers can optionally be blended with barrier aids such as silica.

Alternatively, the formulation may be spray-dried or encapsulated to produce solid particles, which can then be redispersed in a second, possibly different, binder and then coated onto the support.

The formulation for the emulsion layer can also include coating aids such as fluoroaliphatic polyesters.

A support with backside resistive heating layer may also be used in color photothermographic imaging systems such as shown in U.S. Pat. Nos. 4,460,681 and 4,374,921.

Development conditions will vary, depending on the construction used, but will typically involve heating the imagewise exposed material at a suitably elevated temperature.

When used in a photothermographic element, the latent image obtained after exposure of the heat-sensitive construction can be developed by heating the material at a moderately elevated temperature of, for example, about 80° C. to about 250° C., preferably from about 120° C. to about 200° C., for a sufficient period of time, generally from 1 second to 2 minutes. Heating may be carried out by the typical heating means such as a hot plate, an iron, a hot roller, a heat generator using carbon or titanium white, or the like.

When used in a thermographic element, the image may be developed merely by heating at the above noted temperatures using a thermal stylus or print head, or by heating while in contact with a heat-absorbing material.

Use as a Photomask

As noted above, the possibility of low absorbance of the photothermographic and thermographic element at 380 nm in non-imaged areas of the element facilitates the use of the photothermographic and thermographic elements of the present invention in a process where there is a subsequent exposure of an ultraviolet radiation sensitive imageable medium.

For example, imaging the photothermographic element with a white light, monochromatic light, or laser light (i.e., coherent radiation) and subsequent development affords a visible image on the element.

Similarly, developing the thermographic element with a thermal stylus or print head, laser beam, or by heating while in contact with a heat-absorbing material affords a visible image on the element.

The developed photothermographic or thermographic element absorbs ultraviolet radiation in the areas of the element where there is a visible image and transmits ultraviolet radiation in the areas of the element where there is no visible image. The developed element may then be used as a mask and placed between a source of ultraviolet-radiation energy and an ultraviolet-radiation photosensitive imageable medium such as, for example, a photopolymer, diazo material, or photoresist. This process is particularly useful where the imageable medium comprises a printing plate and the photothermographic or thermographic element serves as an image setting film.

Objects and advantages of this invention will now be illustrated by the following examples, but the particular materials and amounts thereof recited in these examples, as well as other conditions and details, should not be construed to unduly limit this invention.

EXAMPLES

These examples provide exemplary synthetic procedures for compounds of the invention. Photothermographic and thermographic imaging constructions (i.e., elements) are shown.

All materials used in the following examples were readily available from standard commercial sources, such as Aldrich Chemical Co. (Milwaukee, Wis.), unless otherwise specified. All percentages are by weight unless otherwise indicated. The following additional terms and materials were used.

Acryloid™ A-21 and B-72 are polymethyl methacrylate polymers available from Rohm and Haas, Philadelphia, Pa.

Airvol™ 523 is a polyvinyl alcohol available from Air Products.

Butvar™ B-72, B-76, and B-79 are polyvinyl butyral resins available from Monsanto Company, St. Louis, Mo.

BX-1 is a polyvinyl butyral resin available from Sekisui Chemical Co.

CA 398-6 is a cellulose acetate polymer available from Eastman Chemical Co., Kingsport, Tenn.

CAO-5 is bis(2-hydroxy-3-t-butyl-5-methylphenyl-)methane, an antioxidant available from Rohm and Haas, Philadelphia, Pa. It is a reducing agent (i.e., a developer) for the non-photosensitive reducible source of silver and has the following structure:

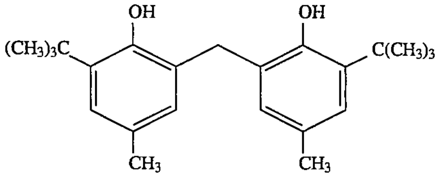
CAO-5

CBBA is 2-(4-chlorobenzoyl)benzoic acid.

MEK is methyl ethyl ketone (2-butanone).

4-MPA is 4-methylphthalic acid.

PAZ is 1-(2H)-phthalazinone.

Permanax™ WSO is 1,1-bis(2-hydroxy-3,5-dimethylphenyl)-3,5,5-trimethylhexane [CAS RN=7292-14-0] and is available from St.-Jean PhotoChemicals, Inc., Quebec. It is also known as Nonox™. It is a reducing agent (i.e., a developer) for the non-photosensitive reducible source of silver.

PET is polyethylene terephthalate.

PHZ is phthalazine.

PHP is pyridinium hydrobromide perbromide.

PVP K-90 is a polyvinyl pyrrolidone available from International Specialty Products.

TCPAN is tetrachlorophthalic anhydride.

Antifoggant A is described in U.S. Pat. No. 5,340,712 and has the following structure:

Antifoggant A

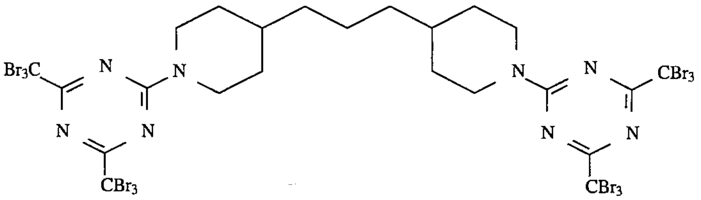

Antifoggant B is 2-methyl-5-tribromomethylsulfonyl-1,3,4-thiadiazole and is described in copending U.S. patent application Ser. No 08/168,994 (filed Dec. 17, 1993) and has the following structure:

Antifoggant B

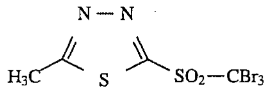

Dye A is a sensitizing dye described in U.S. Pat. No. 4,123,282 and has the following structure:

Sensitizing Dye A

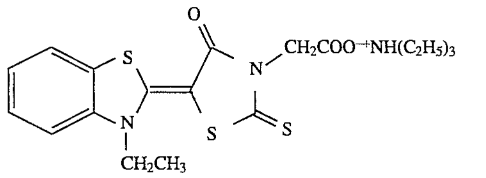

Dye B is an infrared absorbing dye described in U.S. patent application Ser. No. 08/313,011 (filed Sep. 27, 1994) and has the following structure:

(red) and a 0–3 continuous density wedge. The samples were then processed by heating on a heat blanket or a modified 3M Model 9014 Dry Silver Processor equipped with a variable speed and temperature control.

Density measurements were made on a custom built computer scanned densitometer using a filter appropriate to the sensitivity photothermographic element and are believed to be comparable to measurements obtained from commercially available densitometers.

Speed-1 is the Log of the exposure in ergs/cm$^2$ corresponding to a density of 0.20 above $D_{min}$. A low the Speed-1 number indicates that less light is required for an exposure and indicates a "faster" the photothermographic element.

Speed-2 is the Log of the exposure in ergs/cm$^2$ corresponding to a density of 0.60 above $D_{min}$. A low the Speed-2 number indicates that less light is required for an exposure and indicates a "faster" the photothermographic element.

Contrast-1 is the slope of the line joining the density points of 0.30 and 0.90 above $D_{min}$.

Contrast-2 is the slope of the line joining the density points of 0.60 and 1.20 above $D_{min}$.

Preparation of Sulfonyl hydrazides

Dye B

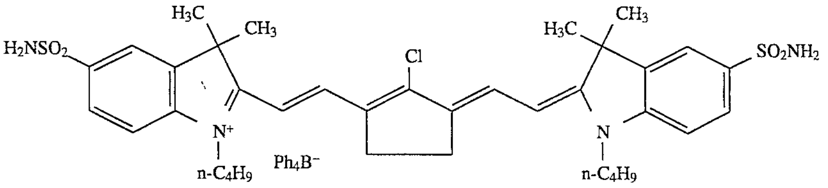

Dye C is a sensitizing dye described in U.S. Pat. No. 3,719,495 and has the following structure:

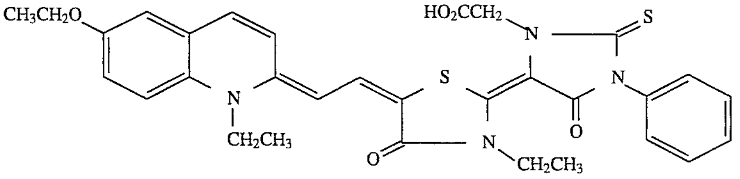

A knife coater was used to coat the photothermographic emulsion and topcoat layers. A support was cut to a length suitable to the volume of solution used, and after raising the hinged knife, placed in position on the coater bed. The knife was then lowered and locked into place. The height of the knife was adjusted with wedges controlled by screw knobs and measured with electronic gauges. The knife was zeroed onto the support and then raised to a clearance corresponding to the desired wet thickness of photothermographic emulsion layer.

An aliquot of the photothermographic emulsion was poured onto the support in front of the knife. The support was immediately drawn past the knife so that a coating was produced. The photothermographic layer was then dried.

A protective topcoat layer was coated on top of the photothermographic layer and dried to form a photothermographic element.

Samples from the coating were exposed using an EG & G Sensitometer for $10^{-3}$ seconds using Xenon flash lamp through a #47B Wratten filter (blue) or a #25 Wratten filter As noted above, sulfonyl hydrazides may be prepared by the reaction of a solution of an acyl hydrazide with a sulfonyl chloride in a pyridine solution. Sulfonyl Hydrazides 3, 4, and 12 were prepared as described below. Other sulfonyl hydrazides were prepared in an analogous manner.

Preparation of Sulfonyl Hydrazide Developer 3; To a stirred solution of 17.45 g (0.103 mol) phenylacetic hydrazide in 100 mL pyridine at 0° C. was added, in portions, 19.61 g (0.103 mol) tosyl chloride. The mixture was allowed to come to room temperature, poured over ice water, stirred 30 minutes, and filtered. The precipitate was washed with 0.1N HCl, water, and methanol and dried to obtain 30.32 g (97%) of Sulfonyl Hydrazide 3. Spectral data were consistant with the proposed structure.

Preparation of Sulfonyl Hydrazide Developer 4: To a stirred slurry of 3.96 g (0.025 mol) octanoic hydrazide in 25 mL pyridine was added in portions, 4.77 g (0.025 mol) tosyl chloride. The octanoic hydrazide dissolved and a slight exotherm was observed. After 2 hours, the reaction mixture was poured into water and the precipitate filtered, washed with 0.1N HCl, water, and then air dried. After recrystallization from methanol, 3.52 g of Sulfonyl Hydrazide 4 was obtained. Spectral data were consistant with the proposed structure.

Preparation of Sulfonyl Hydrazide Developer 12: To a stirred solution of 3.41 g (0.025 mol) benzoic hydrazide in 12.5 mL pyridine was added in portions, 4.76 g (0.025 mol) tosyl chloride. A slight exotherm was observed. After stirring at room temperature for 3 hours, the reaction mixture was poured into water and the precipitate filtered, washed with 0.1N HCl, water, and then air dried. After recrystallization from methanol, 3.29 g (45%) of Sulfonyl Hydrazide 12 was obtained. Spectral data were consistant with the proposed structure.

Example 1

Formulation A: An emulsion of silver behenate half soap was homogenized to 10% solids in toluene and 2-butanone. To 127.0 g of the silver half soap emulsion was added 251.5 g 2-butanone, 104.0 g 2-propanol, and 0.5 g polyvinyl butyral (Butvar™ B-76). After 15 minutes of mixing, 1.0 mL of a 10% pyridine solution in acetone and 4.0 mL of a mercuric bromide solution (prepared by dissolving 0.36 g of $HgBr_2$ in 10 mL of methanol) were added. Then 8.0 mL of a calcium bromide solution (prepared by dissolving 0.236 g of $CaBr_2$ in 10 mL of methanol) was added 30 minutes later. After 2 hours of mixing, 27.0 g of polyvinyl pyrrolidone (PVP K-90) was added, and 27.0 g of polyvinyl butyral (Butvar™ B-76) was added 30 minutes later.

To 64.2 g of the silver premix prepared above was added 4.0 mL of a methanol solution of the Sensitizing Dye A. The solution was prepared by dissolving 0.090 g of dye in 100 mL of methanol.

After 30 minutes, the sulfonyl hydrazide developer solution was added to a 8.43 g aliquot of the sensitized silver premix. The sulfonyl hydrazide developer solution was prepared by mixing the materials shown below.

| Component | Amount |
|---|---|
| Hydrazide | $1.365 \times 10^{-4}$ mol |
| Phthalazinone | 0.035 g |
| Tetrahydrofuran | 1.5 mL |

A topcoat solution was prepared by mixing the materials shown below.

| Component | Amount |
|---|---|
| Cellulose Acetate (Eastman CA 398-6) | 35.5 g |
| Polymethyl methacrylate (Acryloid™ 21) | 8.0 g |
| Phthalazinone | 2.5 g |
| Methanol | 36.0 g |
| 2-Propanol | 98.0 g |
| Acetone | 420.0 g |

The photothermographic emulsion containing the sulfonyl hydrazide developer and topcoat were each coated using a knife coater with a gap set at 3 mil (76.2 µm) on a 4 mil (101 µm) filled polyester base and dried for 4 minutes at 180° F. The samples were exposed using an EG & G Sensitometer for $10^{-3}$ seconds with a Xenon flash through a Wratten #47B filter and a 0 to 3 continuous wedge. The coatings were processed using a heat blanket or a roll processor. The resulting wedges were measured on a computer scanned densitometer using a blue filter.

As noted above, $1.365 \times 10^{-4}$ mol of a variety of sulfonyl hydrazides were exposed and processed. The following table describes the developer, processing conditions, $D_{min}$, and $D_{max}$ of some of these materials. Attempts were made to optimize $D_{max}$ and minimize $D_{min}$ density by varying heating time and temperature. A control using CAO-5, a black-and-white developer was included. $D_{max}$ and $D_{min}$ were determined using the blue filter of a computerized densitometer.

| Example | Developer | Development | $D_{min}$ | $D_{max}$ |
|---|---|---|---|---|
| 1-1 | Hydrazide 1 | 5 seconds at 280° F. | 0.15 | 0.34 |
| 1-2 | Hydrazide 2 | 6 seconds at 275° F. | 0.11 | 0.30 |
| 1-3 | Hydrazide 3 | 5 seconds at 280° F. | 0.19 | 0.43 |
| 1-4 | Hydrazide 4 | 5 seconds at 280° F. | 0.23 | 0.62 |
| 1-5 | Hydrazide 5 | 12 seconds at 250° F. | 0.23 | 0.27 |
| 1-6 | Hydrazide 6 | 10 seconds at 280° F. | 0.24 | 0.40 |
| 1-7 | Hydrazide 9 | 12 seconds at 275° F. | 0.26 | 0.47 |
| 1-8 | Hydrazide 10 | 6 seconds at 275° F. | 0.38 | 0.51 |
| 1-9 | CAO-5 | 6 seconds at 275° F. | 0.11 | 0.91 |

Example 2

Hydrazide 3 was evaluated as a high-contrast developer in a photothermographic element. Two concentrations of hydrazide and two concentrations of PAZ were used. A comparative example employing the commonly used developer CAO-5 was also run.

Formulation B: An emulsion of silver behenate full soap (prepared as described in U.S. Pat. No. 3,839,049) containing pre-formed silver halide grains (9.0 mol % silver halide, 0.05 µm grain size, and 98%:2% Br:I ratio of halides) was homogenized to 11.94% solids in ethanol and toluene (90/10 wt/wt) with 0.48% Butvar™ B-76 polyvinyl butyral. To 200.0 g of the silver full soap emulsion was added 40.0 g of ethanol. After 10 minutes of mixing, 32 g of Butvar™ B-76 polyvinyl butyral was added. Stirring for 30 min was followed by addition of 0.055 g of pyridinium hydrobromide perbromide. Stirring was continued and additional 0.055 g portions of pyridinium hydrobromide perbromide were added after 1 and 2 hours. After a final 4 hours of mixing, 1.3 mL of a 10% calcium bromide solution in methanol was added.

To 45.0 g of the prepared silver premix described above was added 5.4 mL of a solution of Sensitizing Dye A. The solution was prepared by dissolving 0.081 g of dye in 50 mL of methanol.

After 30 minutes, the sulfonyl hydrazide developer solution was added to a 6.57 g aliquot of the dye-sensitized silver premix.

The hydrazide developer solution was prepared by mixing the materials shown below.

| Component | Amount |
|---|---|
| Hydrazide 3 | $2.0 \times 10^{-4}$ mol or $4.0 \times 10^{-4}$ mol |
| CBBA | 0.025 g |
| PAZ | 0.075 g or 0.15 g |
| Tetrahydrofuran | 4.6 mL |
| Antifoggant A | 0.01 g |

A CAO-5 developer solution was prepared by mixing the materials shown below.

| Component | Amount |
|---|---|
| CAO-5 | $2.0 \times 10^{-4}$ mol |
| CBBA | 0.025 g |
| PAZ | 0.075 g |
| Tetrahydrofuran | 4.6 mL |
| Antifoggant A | 0.0124 g |

All photothermographic layers were coated onto a 4 mil (101 μm) filled polyester support using a knife coater with a gap set at 3 mil (76.2 μm). The samples were dried in an oven for 4 minutes at 180° F. (82.2° C.).

A topcoat solution was prepared by mixing the materials shown below.

| Component | Amount |
|---|---|
| Cellulose Acetate (Eastman CA 398-6) | 35.5 g |
| Polymethyl methacrylate (Acryloid™ 21) | 8.0 g |
| Methanol | 36.0 g |
| 2-Propanol | 98.0 g |
| Acetone | 420. g |

The topcoat layers were coated onto the photothermographic emulsion layers using a knife coater with a gap set at 3 mil (76.2 μm). The samples were dried in an oven for 4 minutes at 180° F. (82.2° C.). The samples were exposed and processed for 30 seconds at 280° F. (137.7° C.) as described in Example 1 above. $D_{min}$ and $D_{max}$, Speed-1, Speed-2, Contrast-1, and Contrast-2 of the resulting wedges were measured on a computer scanned densitometer using a blue filter. The results, shown below, demonstrate that sulfonyl hydrazides in Examples 2-1 to 2-4 provide a photothermographic element with high contrast when compared with a similar photothermographic element employing the known developer CAO-5™ in Example C 2-5.

| Ex. | Amount | $D_{min}$ | $D_{max}$ |
|---|---|---|---|
| 2-1 | $2.0 \times 10^{-4}$ + 0.07 g PAZ | 0.12 | 1.23 |
| 2-2 | $4.0 \times 10^{-4}$ + 0.07 g PAZ | 0.13 | 2.06 |
| 2-3 | $2.0 \times 10^{-4}$ + 0.15 g PAZ | 0.12 | 1.32 |
| 2-4 | $4.0 \times 10^{-4}$ + 0.15 g PAZ | 0.13 | 2.00 |
| C 2-5 | $4.0 \times 10^{-4}$ + 0.075 g PAZ | 0.24 | 1.73 |

| Ex. | Speed-1 | Speed-2 | Contrast-1 | Contrast-2 |
|---|---|---|---|---|
| 2-1 | 1.42 | 1.95 | 1.23 | — |
| 2-2 | 1.40 | 2.07 | 1.30 | 3.18 |
| 2-3 | 1.30 | 1.70 | 1.42 | — |
| 2-4 | 1.01 | 1.08 | 7.77 | 10.41 |
| C 2-5 | 0.44 | 0.58 | 1.06 | 2.79 |

Example 3

Sulfonyl hydrazide developers give very high image density and high contrast relative to that obtained with standard hindered phenol developers. The following data show a comparison between Nonox™ developer used as a control and the sulfonyl hydrazide developers of this invention. The following example demonstrates the use of sulfonyl hydrazides as developers in a photothermographic element.

Formulation C: An emulsion of pre-formed silver behenate was homogenized to 12% solids in 2-butanone and toluene with 0.5% polyvinyl butyral. The silver emulsion contained 9% of 0.055 μm silver halide with a halide content of 98% bromide and 2% iodide.

A 200 g portion of this homogenate was used as the silver source for this formulation. The silver emulsion was mixed for 25 min with 40 g of 2-butanone and 32 g of polyvinyl butyral (Butvar B-76™) prior to addition of the reactive ingredients. The temperature was adjusted to 55° F. (12.8° C.) and three additions of 0.055 g of pyridinium hydrobromide perbromide (PHP) were added at 60 min intervals. Stirring for an additional 60 min was followed by the addition of 2 mL of a calcium bromide solution (prepared from 10 g of $CaBr_2$ and 100 mL of methanol). The silver emulsion was mixed for 2 hours, 1.2 g of 2-(4-chlorobenzoyl)benzoic acid (CBBA) was added, and the emulsion was held overnight at 55° F. (12.8° C.).

Two developer pre-mixes were prepared.

Solution A was prepared by dissolving 3 g of Nonox™, 2 g of PAZ, and 0.53 g of Antifoggant B in 100 g of tetrahydrofuran. This solutions was used to prepare a control.

Solution B was prepared by dissolving 2.65 g of Hydrazide Developer 2, 2 g of PAZ, and 0.53 g of Antifoggant B in 100 g of tetrahydrofuran.

Aliquots, 12 g, each of silver emulsion was mixed with 7.5 g of developer solution prior to coating. Two samples of Hydrazide Developer 2 and one sample of Nonox™ were prepared. The mixture was coated onto 4 mil (101 μm) filled polyester (PET) using a knife coater with a gap set at 4 mil (101.6 μm) and dried for 4 min at 170° F. (76.7° C.).

A first protective topcoat solution, Topcoat A, was prepared by dissolving 9 g of cellulose acetate (Eastman CA 398-6) in 111 g of acetone, 55 g of 2-butanone, and 22 g of methanol.

A second protective topcoat solution, Topcoat B, was prepared by dissolving 5 g of Airvol™ 523 (polyvinyl alcohol) in 48 g of water by heating on a steam bath, cooling, and diluting with 48 g of methanol.

The topcoats were coated onto the photothermographic emulsion layer using a knife coater with a gap set at 3 mil (76.2 μm) and dried for 4 min at 170° F. (76.7° C.). Samples were prepared by cutting the coated web into strips and were exposed using an EG & G Sensitometer for $10^{-3}$ seconds with a xenon flash through a #47B Wratten filter and a 0 to 3 continuous wedge. After exposure, the samples were developed by heating. The development times and temperatures reflect the best conditions for each coating. The resulting wedges were measured on a computer scanned densitometer using a blue filter.

The results, shown below, demonstrate that hydrazide developers of this invention afford photothermographic elements with much higher contrast when compared to similar elements incorporating known developers such as Nonox™. The results also demonstrate additional contrast improvement when polyvinyl alcohol rather than cellulose acetate is used as the binder for the topcoat.

| Ex. | Topcoat | Developer | Processing Conditions |
|---|---|---|---|
| 3-1 | A | Hydrazide-2 | 39 sec/142° C. |
| 3-2 | B | Hydrazide-2 | 38 sec/140° C. |
| C 3-3 | A | Nonox ™ | 10 sec/140° C. |

| Ex. | $D_{min}$ | $D_{max}$ | Speed-2 | Contrast-2 |
|---|---|---|---|---|
| 3-1 | 0.10 | 2.10 | 1.81 | 4.64 |

-continued

| | | | | |
|---|---|---|---|---|
| 3-2 | 0.11 | 2.01 | 2.04 | 14.41 |
| C 3-3 | 0.09 | 1.38 | 1.57 | 0.76 |

Example 4

Formulation D: An emulsion of silver behenate half soap was homogenized to 14% solids in ethanol and toluene with 0.5% polyvinyl butyral (Butvar™ B-76). To 195.9 g. of the silver half soap emulsion was added 33.3 g. ethanol. After 15 minutes of mixing, two 1.0 mL aliquots of a zinc bromide solution (prepared by dissolving 1.0 g of $ZnBr_2$ in 10.0 mL of ethanol) were added separately. After 20 minutes another 33.3 g of ethanol was added. A 2.4 mL aliquot of a pyridine solution (prepared by dissolving 0.4 g of pyridine in 10 mL of 2-butanone) was added 15 minutes later. After 4 hours of mixing, 31.75 g of polyvinyl butyral (Butvar™ B-76) was added, followed 30 minutes later by addition of 2.73 mL of a solution of 0.133 g N-bromosuccinamide in 10 mL of methanol.

To 11.52 g of the silver emulsion prepared above was added 1.05 mL of a solution of 0.81 g of Sensitizing Dye A in a mixture of 40 mL ethanol and 10 mL of toluene.

After 30 minutes, the sulfonyl hydrazide developer solution was added. The sulfonyl hydrazide developer solution was prepared by mixing the materials shown below.

| Component | Amount |
|---|---|
| Hydrazide 3 | $4.0 \times 10^{-4}$ mol |
| phthalazinone | 0.15 g |
| Antifoggant A | 0.01 g |
| Tetrahydrofuran | 4.6 mL |

A CAO-5™ developer solution was prepared by mixing the materials shown below.

| Component | Amount |
|---|---|
| CAO-5 ™ | $2.0 \times 10^{-4}$ mol |
| phthalazinone | 0.075 g |
| Antifoggant A | 0.0124 g |
| Tetrahydrofuran | 4.6 mL |

The resulting emulsions were coated onto a 4 mil (101 µm) filled polyester base using a knife coater with a gap set at 3 mil (76.2 µm) and dried at 82° C. for 4 minutes.

A topcoat solution was prepared by mixing the materials shown below.

| Component | Amount |
|---|---|
| Cellulose Acetate (Eastman CA 398-6) | 35.5 g |
| Polymethyl methacrylate (Acryloid™ 21) | 8.0 g |
| Methanol | 36.0 g |
| 2-Propanol | 98.0 g |
| Acetone | 420.0 g |

The topcoat solutions were coated onto the photothermographic emulsion layers using a knife coater with a gap set at 3 mil (76.2 µm) and dried at 82° C. for 4 minutes.

The samples were exposed using an EG & G Sensitometer for $10^{-3}$ seconds with a xenon flash through a #47B Wratten filter and a 0 to 3 continuous wedge. The coatings were processed at 280° F. (137.8° C.) for 20–30 seconds using a heat blanket. The resulting wedges were measured on a computer scanned densitometer using a blue filter.

| Ex. | Processing Time | $D_{min}$ | $D_{max}$ | Speed-2 | Contrast-2 |
|---|---|---|---|---|---|
| 4-1 | 20 seconds | 0.12 | 2.16 | 2.00 | 4.70 |
| 4-2 | 25 seconds | 0.13 | 2.13 | 1.75 | 12.27 |
| 4-3 | 30 seconds | 0.14 | 2.19 | 1.63 | 10.04 |
| C 4-4 | 20 seconds | 0.13 | 1.76 | 1.73 | 4.14 |
| C 4-5 | 25 seconds | 0.13 | 1.76 | 1.63 | 4.50 |
| C 4-6 | 30 seconds | 0.16 | 1.78 | 1.53 | 4.82 |

The results above demonstrate that the sulfonyl hydrazide developers of this invention afford photothermographic elements with much higher contrast when compared with similar elements incorporating a known developer such as CAO-5.

Example 5

Example 5 demonstrates the use of hydrazides 3, 4, and 5 as developers for photothermographic elements to form images having high density and high contrast.

Sulfonyl hydrazide developer solutions were prepared by mixing the materials shown below.

| Component | Amount |
|---|---|
| Sulfonyl Hydrazide 3, 4, or 5 | $4.0 \times 10^{-4}$ mol |
| 2-(4-chlorobenzoyl) benzoic acid (CBBA) | 0.25 g |
| Phthalazinone | 0.15 g |
| Tetrahydrofuran | 4.6 mL |
| Antifoggant A | 0.01 g |

After 30 minutes, the hydrazide developer solution was added to a 6.57 g aliquot of the blue sensitized silver premix prepared as in Example 2 above.

The resulting solution was coated onto a 4 mil (101 µm) filled polyester base using a knife coater with a gap set at 3 mil (76.2 µm) and dried at 82° C. for 4 minutes.

A topcoat solution was prepared by mixing the materials shown below.

| Component | Amount |
|---|---|
| Cellulose Acetate (Eastman CA 398-6) | 35.5 g |
| Polymethyl methacrylate (Acryloid™ 21) | 8.0 g |
| Methanol | 36.0 g |
| 2-Propanol | 98.0 g |
| Acetone | 420. g |

The topcoat solutions were coated onto the photothermographic emulsion layers using a knife coater with a gap set at 3 mil (76.2 µm) and dried at 82° C. for 4 minutes.

The samples were exposed using an EG & G Sensitometer for $10^{-3}$ seconds with a Xenon flash through a #47B Wratten filter and a 0 to 3 continuous wedge. The coatings were processed at 280° F. (137.8° C.) for 20–30 seconds using a heat blanket. The resulting wedges were measured on a computer densitometer using a blue filter.

| Ex. | Hydrazide | Processing Time | $D_{min}$ | $D_{max}$ | Speed-2 | Contrast-2 |
|---|---|---|---|---|---|---|
| 5-1 | 3 | 20 seconds | 0.13 | 2.08 | 1.64 | 3.51 |
| | | 30 seconds | 0.15 | 2.07 | 1.02 | 8.32 |

-continued

| Ex. | Hydra-zide | Processing Time | $D_{min}$ | $D_{max}$ | Speed-2 | Contrast-2 |
|---|---|---|---|---|---|---|
| 5-2 | 4 | 30 seconds | 0.13 | 2.11 | 1.23 | 5.56 |
| | | 40 seconds | 0.14 | 2.09 | 1.10 | 7.08 |
| 5-3 | 5 | 30 seconds | 0.12 | 2.09 | 1.61 | 3.79 |
| | | 40 seconds | 0.13 | 2.07 | 1.27 | 6.10 |

Example 6

Comparative Example

The following Example demonstrates that hydrazides that do not contain a sulfonyl group do not result in high contrast materials when used as developers in photothermographic elements.

A photothermographic emulsion was prepared as described in Formulation C of Example 3 above, but the 2-(4-chlorobenzoyl)benzoic acid (CBBA) was omitted. Instead, compounds known to have a similar effect in photothermographic elements tetrachlorophthalic anhydride (TCPAN) and 4-methylphthalic acid (4-MPA), were placed in the topcoat.

Aliquots, 12 g each, of silver emulsion was mixed with 7.5 g of developer solution prior to coating. Two developers were used, one using Nonox™ and the other using a hydrazide which did not contain a sulfonyl group. The hydrazide which did not contain a sulfonyl group is a trityl hydrazide having the structure shown below.

Hydrazide A $CH_3(CH_2)_6$—CO—NHNH—C—$Ph_3$

Solution A was prepared by dissolving 3 g of Nonox™, 2 g of PAZ, and 0.4 g of Antifoggant A in 100 g of tetrahydrofuran.

Solution B was prepared by dissolving 2.9 g of Hydrazide A, 2 g of PAZ, and 0.4 g of Antifoggant A in 100 g of tetrahydrofuran. The photothermographic emulsions were coated onto 4 mil (101 μm) filled polyester (PET) using a knife coater with a gap set at 4 mil (101.6 μm) and dried for 4 min at 170° F. (76.7° C.).

A topcoat solution was prepared by mixing the materials shown below.

| Component | Amount |
|---|---|
| Cellulose Acetate (Eastman CA 398-6) | 9.0 g |
| Tetrachlorophthalic anhydride (TCPAN) | 0.1 g |
| 4-Methylphthalic acid (4-MPA) | 0.1 g |
| Acetone | 111. g |
| 2-Butanone | 55. g |
| Methanol | 22. g |

The topcoat solution was coated onto the photothermographic emulsion layers using a knife coater with a gap set at 3 mil (76.2 μm) and dried at 82° C. for 4 minutes.

Samples were prepared by cutting the coated web into strips and were exposed using an EG & G Sensitometer for $10^{-3}$ seconds with a xenon flash through a #47B Wratten filter and a 0 to 3 continuous wedge. After exposure, the samples were developed by heating. The development times and temperatures reflect the best conditions for each coating. The resulting wedges were measured on a computer scanned densitometer using a blue filter.

| Ex. | Developer | Development Conditions |
|---|---|---|
| 6-1 | Nonox | 15 seconds at 136° C. |
| 6-2 | Hydrazide A | 30 seconds at 136° C. |

| Ex. | $D_{min}$ | $D_{max}$ | Speed-2 | Contrast-2 |
|---|---|---|---|---|
| 6-1 | 0.10 | 1.54 | 1.84 | 1.26 |
| 6-2 | 0.09 | 0.10 | * | * |

*Speed and Contrast cannot be read when $D_{max}$ is very low.

Example 7

The following example demonstrates the use of sulfonyl hydrazides as developers in thermographic elements.

Formulation E: A 10% silver behenate full soap in 2-butanone was homogenized as described in U.S. Pat. No. 4,210,717. BX-1 polyvinyl butyral (10.0 g) and 2-butanone (50.0 g) were added and the emulsion mixed for 2 hours. The silver soap emulsion was held for 24 hours before use.

Thermographic coating dispersions were prepared by mixing the following materials.

| Material | Amount |
|---|---|
| Silver Behenate full soap emulsion | 15.0 g |
| Hydrazide 3 | 0.991 g |
| Succinamide | 0.2 g |
| Tetrachlorophthalic anhydride | 0.1 g |
| Barbituric acid | 0.05 g |
| Dye-B | 0.05 g |
| Methanol | 4.0 mL |
| 2-Butanone | 1.0 mL |
| Tetrahydrofuran | 2.0 mL |

The dispersion was coated onto 3 mil (76.2 μm) polyester film using a knife coater with the gap set at 3 mil (76.2 μm). The coating was dried at 60° C. for 3 min. A laser sensitometer was used to evaluate the thermographic imaging element. A 700 milliwatt beam emitted from a 2361-P2 fiber optic coupled laser diode (available from Spectra Diode Laboratories) was focused onto a piece of thermographic element placed on the surface of a rotating drum. The core diameter of the fiber optic was 100 μm and the wavelength of the laser was 826 nm. The power at the rotating drum was 210 milliwatts and the spot shape was a flat tipped cone with a spot size of 45 μm at full width half maximum (FWHM). The sample was evaluated using linear writing rates of 40, 80, and 120 cm/sec.

The optical densities of the written spots were evaluated using a Macbeth Model TD 523 densitometer equipped with a #18A Wratten filter. The results, shown below, demonstrate that the sulfonyl hydrazides can act as a developer in a thermographic construction.

| Writing Rate | U.V. Optical Density |
|---|---|
| 40 cm/sec | 0.49 |
| 80 cm/sec | 0.17 |
| 120 cm/sec | 0.14 |

Examples 8–10

Examples 8–10 describe the use of electron transfer agents in the photothermographic elements of this invention.

Example 8

The following example demonstrates that the addition of phenidone (1-phenyl-3-pyrazolidinone) as an electron transfer agent enhances the reactivity of the sulfonyl hydrazide and provides higher $D_{max}$ and photospeed.

Formulation F: A dispersion of silver behenate half soap was homogenized to 10% solids in ethanol and toluene (90/10 wt/wt) with 0.5% Butvar™ B-72. To 205 g of the silver half soap dispersion was added 285 g of ethanol. After 10 minutes of mixing, 6.0 mL of a methanolic mercuric bromide solution (prepared from 0.36 g of $HgBr_2$ in 20 mL of methanol) was added. After 3 hours, 8.0 mL of a methanolic zinc bromide solution (prepared from 0.45 g of $ZnBr_2$ and 20 mL of methanol) was added. Mixing for an additional 1 hour was followed by addition of 26 g of Butvar™ B-72. This afforded a "silver premix."

To 64.2 g of the silver premix prepared above was added 4.0 mL of a methanol solution of the Sensitizing Dye A. The solution was prepared by dissolving 0.090 g of dye in 100 mL of methanol.

After 30 minutes, the sulfonyl hydrazide developer solution was added to a 8.43 g aliquot of the sensitized silver premix. The sulfonyl hydrazide developer solution was prepared by mixing the materials shown below.

A solution of 0.022 1 g of phenidone in 50 mL of methanol was prepared. Various amounts were added to the developer solution. To Example 8-1 was added 0.00 mL, to Example 8-2 was added 0.1 mL, and to Example 8-3 was added 1.0 mL.

| Component | Amount |
|---|---|
| Sulfonyl Hydrazide 4 | $1.365 \times 10^{-4}$ mol |
| Phenidone Solution | see above |
| Phthalazinone | 0.035 g |
| Tetrahydrofuran | 1.5 mL |

A topcoat solution was prepared by mixing the materials shown below.

| Component | Amount |
|---|---|
| Cellulose Acetate (Eastman CA 398-6) | 35.5 g |
| Polymethyl methacrylate (Acryloid ™ 21) | 8.0 g |
| Phthalazinone | 2.5 g |
| Methanol | 36.0 g |
| 2-Propanol | 98.0 g |
| Acetone | 420. g |

The photothermographic emulsion containing the sulfonyl hydrazide developer and topcoat were each coated using a knife coater with a gap set at 3 mil (76.2 μm) on a 4 mil (101 μm) filled polyester base and dried for 4 minutes at 180° F. The samples were exposed using an EG & G Sensitometer for $10^{-3}$ seconds with a Xenon flash through a Wratten #47B filter and a 0 to 3 continuous wedge. The coatings were processed using a heat blanket or a roll processor by heating for 40 seconds at 280° F. (138° C.). The resulting wedges were measured on a computer scanned densitometer using a blue filter.

As shown by the results below, the addition of the phenidone solution enhanced the reactivity of the sulfonyl hydrazide developer and provided higher $D_{max}$ and photospeed.

| Ex. | $D_{min}$ | $D_{max}$ | Speed-1 | Relative Exposure* |
|---|---|---|---|---|
| 8-1 | 0.05 | 0.28 | 2.64 | 437 |
| 8-2 | 0.05 | 0.32 | 2.47 | 295 |
| 8-3 | 0.09 | 0.56 | 1.76 | 58 |

*Relative exposure based on Speed-1. The smaller the number indicates less exposure was required to image the photothermographic element.

Example 9

The following example demonstrates that the addition of phenidone (1-phenyl-3-pyrazolidinone) as an electron transfer agent enhances the reactivity of the sulfonyl hydrazide and provides higher $D_{max}$ and photospeed. This example also demonstrates that the addition of an electron transfer agent such as phenidone to a typical hindered phenol developer (CAO-5) results in a fogged element.

To a 6.57 g aliquot of the blue-sensitized pre-formed silver premix prepared as described in Example 2 was added $2.0 \times 10^{-4}$ mol of either sulfonyl hydrazide developer or CAO-5.

A solution of 0.022 g of phenidone in 50 of methanol was prepared. Various amounts were added to the developer solution. To Example 9-1 was added 0.00 mL and to Example 9-2 was added 0.25 mL.

| Component | Amount |
|---|---|
| Developer (Hyrazide 3 or CAO-5) | $2.0 \times 10^{-4}$ mol |
| Phenidone Solution | (see above) |
| 2-(4-chlorobenzoyl)benzoic acid (CBBA) | 0.025 g |
| Phthalazinone | 0.075 g |
| Tetrahydrofuran | 4.6 mL |

A topcoat solution was prepared as described in Example 2 above, except that 0.4 g of Antifoggant B was added for each 100 g of topcoat solution. A photothermographic element was prepared by coating and drying as described in Example 2.

Samples of the photothermographic element were exposed and processed as described in Example 2 using a blue filter. As shown by the results below, the addition of the phenidone enhanced the reactivity of the sulfonyl hydrazide developer and provided higher $D_{max}$ and photospeed.

| Ex. | Developer | Processing | Conditions | Dmin | Dmax |
|---|---|---|---|---|---|
| 9-1a | Hydrazide 3- No Phenidone | 20 seconds | 280° F. | 0.12 | 1.32 |
| 9-1b | Hydrazide 3- No Phenidone | 30 seconds | 280° F. | 0.13 | 1.54 |
| 9-1c | Hydrazide 3- No Phenidone | 40 seconds | 280° F. | 0.15 | 1.51 |
| 9-2a | Hydrazide 3- with Phenidone | 20 seconds | 280° F. | 0.13 | 1.49 |
| 9-2b | Hydrazide 3- with Phenidone | 30 seconds | 280° F. | 0.17 | 1.75 |
| 9-2c | Hydrazide 3- with Phenidone | 40 seconds | 280° F. | 0.21 | 1.75 |
| 9-3a | CAO-5 ™- No Phenidone | 10 seconds | 280° F. | 0.14 | 1.81 |
| 9-3b | CAO-5 ™- No Phenidone | 20 seconds | 280° F. | 0.40 | 1.96 |

| Ex. | Speed-1 | Speed-2 | Contrast-1 | Contrast-2 | Relative Exposure* |
|---|---|---|---|---|---|
| 9-1a | 1.80 | 2.41 | 1.05 | 1.25 | 257 |
| 9-1b | 1.39 | 1.57 | 2.96 | 3.23 | 37 |
| 9-1c | 1.23 | 1.33 | 4.54 | 3.96 | 21 |

-continued

| | | | | | |
|---|---|---|---|---|---|
| 9-2a | 1.69 | 2.27 | 1.08 | 1.56 | 186 |
| 9-2b | 1.30 | 1.45 | 3.04 | 3.22 | 28 |
| 9-2c | 1.03 | 1.13 | 5.38 | 6.96 | 13 |
| 9-3a | 1.07 | 1.48 | 1.09 | 1.36 | 30 |
| 9-3b | 0.61 | 0.74 | 4.19 | 5.42 | 6 |

*Relative exposure based on Speed-2. The smaller the number indicates less exposure was required to image the photothermographic element.

Example 10

To 64.2 g of the silver premix prepared as described in Example 8 above, was added 4.0 mL of a methanol/toluene solution of the Sensitizing Dye C. The dye solution was prepared by dissolving 0.0056 g of Dye C in 36.4 mL of toluene and 13.4 mL of methanol.

After 30 minutes, a sulfonyl hydrazide developer solution was added to a 8.43 g aliquot of the sensitized silver premix. The sulfonyl hydrazide developer solutions were prepared by mixing the materials shown below.

A solution of 0.0221 g of phenidone in 50 mL of methanol was prepared. Various amounts were added to each developer solution. For instance to Examples 10-1a, 10-2a, and 10-3a were added 0.00 mL and to Examples 10-1, 10-2b, and 10-3b were added 1.0 mL.

| Component | Amount |
|---|---|
| Sulfonyl Hydrazide 3, 4, 11 | $2.73 \times 10^{-4}$ mol |
| Phenidone Solution | see above |
| Phthalazinone | 0.07 g |
| Tetrahydrofuran | 2.5 mL |

A topcoat solution was prepared as described in Example 1 above.

| Component | Amount |
|---|---|
| Cellulose Acetate (Eastman CA 398-6) | 35.5 g |
| Polymethyl methacrylate (Acryloid ™ 21) | 8.0 g |
| Phthalazinone | 2.5 g |
| Methanol | 36.0 g |
| 2-Propanol | 98.0 g |
| Acetone | 420. g |

A subbing layer was prepared using a 15% (wt) solution of polyvinyl chloride/polyvinyl acetate (VYNS™) in 50/50 wt % 2-butanone/toluene. This solution was coated onto a 4 mil (101 μm) filled polyester base and dried for 4 minutes at 180° F. The photothermographic emulsion containing the sulfonyl hydrazide developer and topcoat were subsequently coated using a knife coater with a gap set at 3 mil (76.2 μm) on a 4 mil (101 μm) filled polyester base and also dried for 4 minutes at 180° F.

The samples were exposed using an EG & G Sensitometer for $10^{-3}$ seconds with a Xenon flash through a Wratten #25 filter and a 0 to 3 continuous wedge. The coatings were processed using a heat blanket or a roll processor by heating. The resulting wedges were measured on a computer scanned densitometer using a #25 Wratten Filter filter.

As shown by the results below, the addition of the phenidone solution enhanced the reactivity of the sulfonyl hydrazide developers and provided higher $D_{max}$ and photospeed.

| Ex. | Developer | Processing | Conditions | Dmin | Dmax |
|---|---|---|---|---|---|
| 10-1a | Hydrazide 4- No Phenidone | 30 seconds | 280° F. | 0.04 | 0.54 |
| 10-1b | Hydrazide 4- with Phenidone | 30 seconds | 280° F. | 0.11 | 0.92 |
| 10-2a | Hydrazide 3- No Phenidone | 5 seconds | 280° F. | 0.05 | 0.35 |
| 10-2b | Hydrazide 3- with Phenidone | 5 seconds | 280° F. | 0.15 | 0.81 |
| 10-3a | Hydrazide 11- No Phenidone | 10 seconds | 280° F. | 0.04 | 0.57 |
| 10-3b | Hydrazide 11- with Phenidone | 10 seconds | 280° F. | 0.14 | 0.85 |

| Ex. | Speed-1 | Speed-2 | Relative Exposure* |
|---|---|---|---|
| 10-1a | 1.82 | — | 66 |
| 10-1b | 1.29 | 2.27 | 19 |
| 10-2a | 2.23 | — | 170 |
| 10-2b | 1.13 | 2.44 | 13 |
| 10-3a | 1.61 | — | 41 |
| 10-3b | 1.11 | 2.29 | 13 |

*Relative exposure is based on Speed-1

Reasonable modifications and variations are possible from the foregoing disclosure without departing from either the spirit or scope of the present invention as defined by the claims.

What is claimed is:

1. A process comprising the steps of:

(a) exposing a heat-developable, black-and-white photothermographic element to light and thereafter heating said element to form a visible image thereon;

(b) positioning said element with a visible image thereon between a source of ultraviolet radiation and an ultraviolet radiation photosensitive imageable medium, and (c) then exposing said ultraviolet radiation sensitive imageable medium to ultraviolet radiation through said visible image on said element, thereby absorbing ultraviolet radiation in the areas of said element where there is a visible image and transmitting ultraviolet radiation where there is no visible image on said element;

said heat-developable, black-and-white photothermographic element comprising a support bearing at least one photosensitive, image-forming photothermographic emulsion layer comprising:

(a) a photosensitive silver halide;

(b) a non-photosensitive, reducible silver source;

(c) a reducing agent for said non-photosensitive, reducible silver source; and (d) a binder;

wherein said reducing agent for said non-photosensitive reducible silver source consists essentially of a compound of the formula:

$$R^1—CO—NHNH—SO_2—R^2$$

wherein:

$R^1$ and $R^2$ are each independently selected from the group consisting of: alkyl and alkenyl groups of up to 20 carbon atoms; alkoxy groups of up to 20 carbon atoms; aryl, alkaryl, and aralkyl groups of up to 20 carbon atoms; aryloxy groups of up to 20 carbon atoms; non-aromatic and aromatic heterocyclic ring groups containing up to 6 ring atoms; alicyclic ring groups containing up to 6 ring carbon atoms; and fused ring and bridging groups containing up to 14 ring atoms.

2. The process of claim 1 wherein said imageable medium is a resist developable, ultraviolet radiation sensitive imageable medium.

3. The process of claim 1 wherein said exposing of said element in step (a) is done with a red or infrared emitting laser or red or infrared emitting laser diode.

4. The process of claim 3 wherein said ultraviolet radiation sensitive imageable medium is a printing plate.

5. A process comprising the steps of:

(a) heating a black-and-white thermographic element to form a visible image thereon;

(b) positioning said element with a visible image thereon between a source of ultraviolet radiation and an ultraviolet radiation photosensitive imageable medium; and (c) then exposing said ultraviolet radiation sensitive imageable medium to ultraviolet radiation through said visible image on said element, thereby absorbing ultraviolet radiation in the areas of said element where there is a visible image and transmitting ultraviolet radiation where there is no visible image on said element;

said black-and-white thermographic element comprising a support bearing at least one heat-sensitive, thermographic emulsion layer comprising:

(a) a non-photosensitive, reducible silver source;

(b) a reducing agent for said non-photosensitive, reducible silver source; and (c) a binder;

wherein said developer for said non-photosensitive reducible silver source consists essentially of a compound of the formula:

$$R^1—CO—NHNH—SO_2—R^2$$

wherein:

$R^1$ and $R^2$ are each independently selected from the group consisting of: alkyl and alkenyl groups of up to 20 carbon atoms; aryl, alkaryl, and aralkyl groups of up to 20 carbon atoms; aryloxy groups of up to 20 carbon atoms; non-aromatic and aromatic heterocyclic ring groups containing up to 6 ring atoms; alicyclic ring groups containing up to 6 ring carbon atoms; and fused ring and bridging groups containing up to 14 ring atoms.

6. The process of claim 5 wherein said imageable medium is a resist developable, ultraviolet radiation sensitive imageable medium.

7. The process of claim 6 wherein said exposing of the element is done with a red or infrared emitting laser or red or infrared emitting laser diode.

8. The process of claim 7 wherein said ultraviolet radiation sensitive imageable medium is a printing plate.

* * * * *